(12) United States Patent
Guo et al.

(10) Patent No.: US 12,133,385 B2
(45) Date of Patent: Oct. 29, 2024

(54) BOTTOM SELECT GATE CONTACTS FOR CENTER STAIRCASE STRUCTURES IN THREE-DIMENSIONAL MEMORY DEVICES

(71) Applicant: Yangtze Memory Technologies Co., Ltd., Hubei (CN)

(72) Inventors: Jason Guo, Hubei (CN); Qiang Tang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 648 days.

(21) Appl. No.: 17/117,619

(22) Filed: Dec. 10, 2020

(65) Prior Publication Data
US 2022/0139950 A1    May 5, 2022

Related U.S. Application Data

(63) Continuation of application No. PCT/CN2020/126468, filed on Nov. 4, 2020.

(51) Int. Cl.
*H10B 43/27* (2023.01)
*H10B 41/10* (2023.01)
(Continued)

(52) U.S. Cl.
CPC ............ *H10B 43/27* (2023.02); *H10B 41/10* (2023.02); *H10B 41/27* (2023.02); *H10B 43/10* (2023.02)

(58) Field of Classification Search
CPC ........ H10B 41/10; H10B 41/20; H10B 41/27; H10B 41/35; H10B 43/10; H10B 43/27; H10B 43/35
See application file for complete search history.

(56) References Cited

U.S. PATENT DOCUMENTS

| 8,999,844 B2 * | 4/2015 | Freeman ........... H01L 21/76838 |
| | | 438/666 |
| 10,014,305 B2 | 7/2018 | Ramaswamy |
| 10,062,745 B2 | 8/2018 | Ramaswamy |

(Continued)

FOREIGN PATENT DOCUMENTS

| CN | 111492480 A | 8/2020 |
| CN | 111540743 A | 8/2020 |

(Continued)

OTHER PUBLICATIONS

International Search Report of the International Searching Authority directed to related International Patent Application No. PCT/CN2020/126468, mailed Aug. 2, 2021; 4 pages.

*Primary Examiner* — Walter H Swanson
*Assistant Examiner* — Jacob T Nelson
(74) *Attorney, Agent, or Firm* — Conley Rose, P.C.

(57) ABSTRACT

A three-dimensional (3D) memory device and a fabricating method for forming the same are disclosed. The 3D memory device can include an alternating conductor/dielectric layer stack disposed on a substrate, a first staircase structure and a second staircase structure formed in the alternating conductor/dielectric layer stack, a staircase bridge extending in a first direction and electrically connecting the first staircase structure and the second staircase structure, and a first bottom select gate segment covered or partially covered by the staircase bridge. The first bottom select gate segment can include an extended portion extending in a second direction different from the first direction.

21 Claims, 26 Drawing Sheets

(51) Int. Cl.
    *H10B 41/27*    (2023.01)
    *H10B 43/10*    (2023.01)

(56) References Cited

U.S. PATENT DOCUMENTS

| | | | |
|---|---|---|---|
| 10,074,558 B1 | 9/2018 | Tsai et al. | |
| 10,553,604 B2 | 2/2020 | Lu et al. | |
| 10,818,324 B2 | 10/2020 | Castro et al. | |
| 11,665,892 B2 | 5/2023 | Sun et al. | |
| 11,696,439 B2 | 7/2023 | Zhang et al. | |
| 2012/0119283 A1* | 5/2012 | Lee | H10B 41/20 257/314 |
| 2014/0252454 A1 | 9/2014 | Rabkin et al. | |
| 2015/0064900 A1* | 3/2015 | Lee | H10B 43/27 438/653 |
| 2016/0284765 A1 | 9/2016 | Takeguchi et al. | |
| 2018/0121345 A1 | 5/2018 | Li et al. | |
| 2019/0115358 A1* | 4/2019 | Lee | H01L 23/562 |
| 2019/0139978 A1* | 5/2019 | Kim | H10B 43/27 |
| 2020/0083242 A1 | 3/2020 | Jeong et al. | |

FOREIGN PATENT DOCUMENTS

| | | |
|---|---|---|
| CN | 111566813 A | 8/2020 |
| CN | 111819690 A | 10/2020 |
| TW | 201336022 A | 9/2013 |
| TW | 201824516 A | 7/2018 |
| TW | 201842650 A | 12/2018 |
| TW | 201916252 A | 4/2019 |
| TW | 201931576 A | 8/2019 |
| TW | 202029190 A | 8/2020 |

* cited by examiner

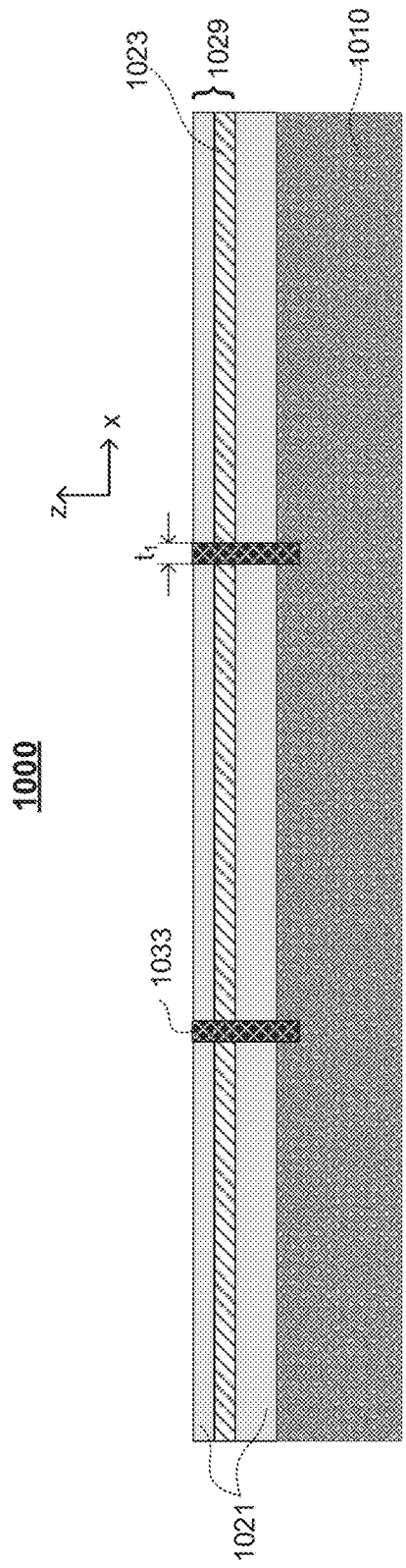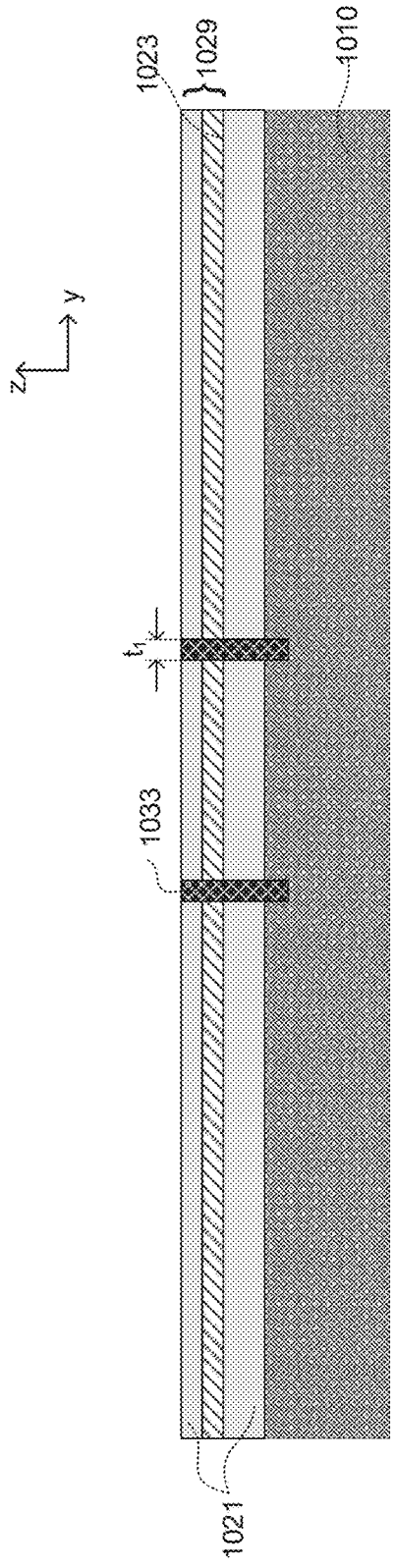

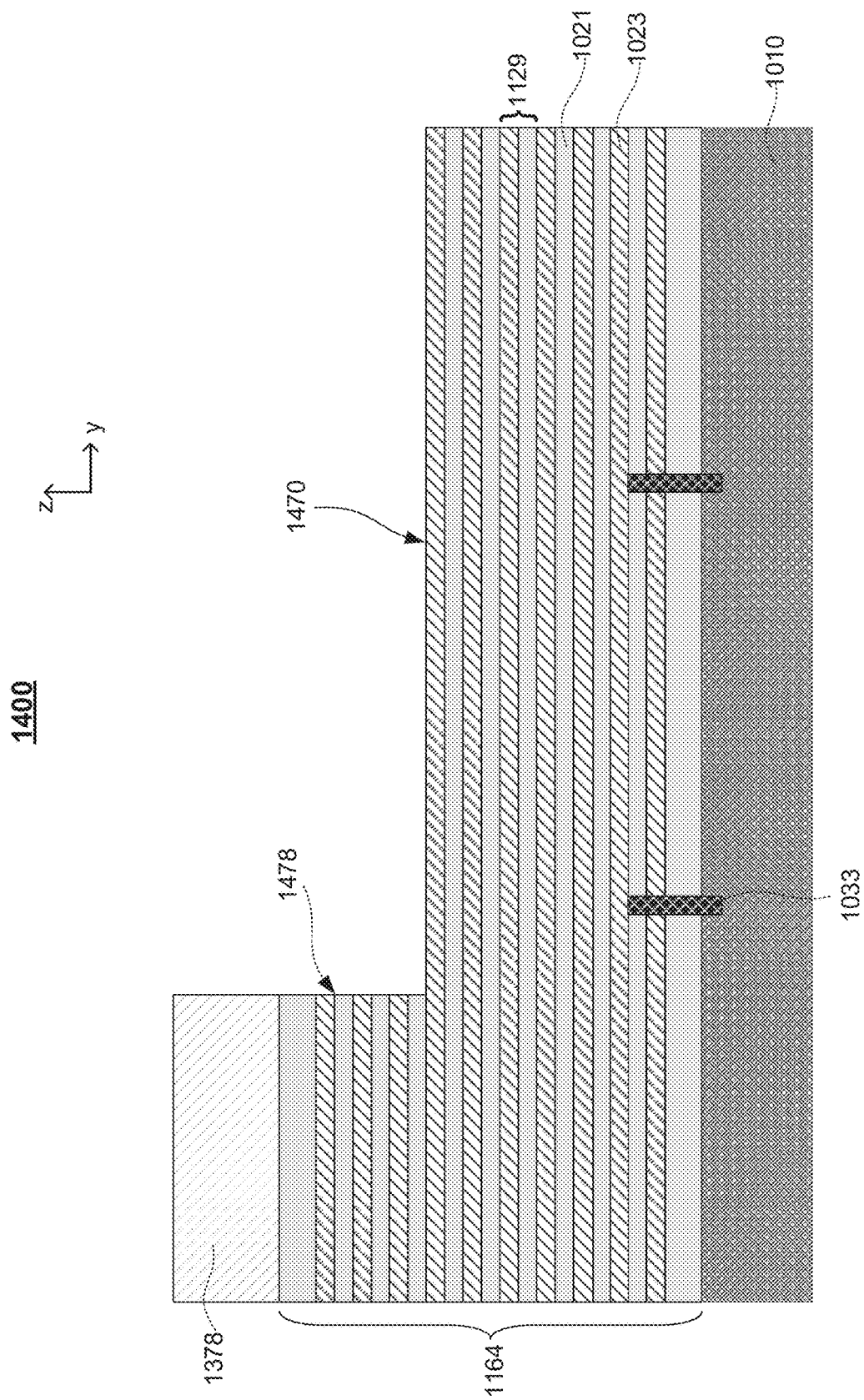

BOTTOM SELECT GATE CONTACTS FOR CENTER STAIRCASE STRUCTURES IN THREE-DIMENSIONAL MEMORY DEVICES

CROSS-REFERENCE TO RELATED APPLICATIONS

This application claims priority to PCT Application No. PCT/CN2020/126468, filed on Nov. 4, 2020, which is incorporated herein by reference in its entirety.

TECHNICAL FIELD

The present disclosure generally relates to the field of semiconductor technology, and more particularly, to a method for forming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND memory, memory cells can be vertically stacked to increase storage capacity per unit area, where memory cells can be addressed from a shared word line. To access word lines of the vertically stacked memory cells, staircase structures can be formed at one or both edges of the memory array. However, to further increase storage capacity of a 3D NAND memory, the number of memory cells and the size of the memory array have been increased greatly. As a result, the distance between the memory cells in the middle of the memory array and the electrical connections at the end of word lines increases, leading to larger parasitic resistance and slower read/write speed. Thus, a need exists for improvement in the staircase structures in a 3D NAND memory to achieve higher storage density without sacrificing the performance.

BRIEF SUMMARY

Embodiments of a three-dimensional (3D) memory device and methods for forming the same are described in the present disclosure.

One aspect of the present disclosure provides a three-dimensional (3D), memory device, comprising: an alternating conductor/dielectric layer stack disposed on a substrate; a first staircase structure and a second staircase structure formed in the alternating conductor/dielectric layer stack; a staircase bridge extending in a first direction and electrically connecting the first staircase structure and the second staircase structure; and a first bottom select gate segment covered or partially covered by the staircase bridge, wherein the first bottom select gate segment includes an extended portion extending in a second direction different from the first direction.

In some embodiments, the alternating conductor/dielectric layer stack includes a plurality of conductive layers and dielectric layer arranged alternatively in a vertical direction; the staircase bridge is configured to electrically connect the conductive layers in the first staircase structure with the conductive layers in the second staircase structure, respectively.

In some embodiments, the staircase bridge comprises the plurality of conductive and dielectric layer pairs.

In some embodiments, the 3D memory device further comprises at least one first bottom select gate contact contacting the extended portion of the first bottom select gate segment.

In some embodiments, the 3D memory device further comprises a bottom select gate cut structure separating a bottom conductive layer of the alternating conductor/dielectric layer stack to at least the first bottom select gate segment and a second bottom select gate segment; wherein the bottom select gate cut structure includes one or more non-linear sections.

In some embodiments, the bottom select gate cut structure separates the second bottom select gate segment into two sub-portions of the second bottom select gate segment; and the two sub-portions of the second bottom select gate segment are electrically connected with each other through at least two second bottom select gate contacts and a conductive line in a patterned conductive layer located above the alternating conductor/dielectric layer stack.

In some embodiments, the non-linear sections of the bottom select gate cut structure include a first straight portion extended along the first direction and a second straight portion extended along the second direction.

In some embodiments, the staircase bridge comprises a top longer than a bottom in the first direction.

In some embodiments, the 3D memory device further comprises a plurality of memory strings vertically penetrating through the alternating conductor/dielectric layer stack, the plurality of memory strings each comprising: a core filling film in a center; a channel layer surrounding the core filling film; and a memory film surrounding the channel layer.

In some embodiments, the plurality of memory strings are distributed on opposite sides of the first staircase structure and the second staircase structure.

In some embodiments, the first staircase structure and the second staircase structure are located in a center of a memory array of the 3D memory device.

Another aspect of the present disclosure provides a method for forming a three-dimensional (3D) memory device, comprising: forming at least one bottom select gate cut structure in at least one bottom dielectric layer pair on a substrate, wherein the at least one bottom select gate cut structure include one or more non-linear sections; forming an alternating dielectric stack on the at least one bottom dielectric layer pair, wherein the alternating dielectric stack comprises a plurality of dielectric layers and sacrificial layers arranged alternatively in a vertical direction; and forming a first dielectric staircase structure, a second dielectric staircase structure and a dielectric bridge in the alternating dielectric stack, wherein the first and second dielectric staircases are connected by the dielectric bridge extended in a first direction.

In some embodiments, the method further comprises: replacing the sacrificial layers in the alternating dielectric stack and the at least one bottom dielectric layer pair with a plurality of conductive layers to form an alternating conductor/dielectric layer stack.

In some embodiments, the method further comprises: forming a plurality of contact structures on the conductive layers of the alternating conductor/dielectric layer stack; wherein a bottom conductive layer of the alternating conductor/dielectric layer stack is divided by the at least one bottom select gate cut structure to a first bottom select gate segment and a second bottom select gate segment.

In some embodiments, forming the plurality of contact structures comprises forming at least one first bottom select gate contact contacting with an extended portion of the first bottom select gate segment that extends along a second direction different from the first direction.

In some embodiments, forming the plurality of contact structures comprises forming at least two second bottom select gate contacts contacting with at least two sub-portions of the second bottom select gate segment.

In some embodiments, the method further comprises forming a patterned conductive layer including at least one connecting line electrically connected the at least two sub-portions of the second bottom select gate segment through the at least two second bottom select gate contacts.

In some embodiments, the method further comprises: forming a plurality of memory strings vertically penetrating through the alternating dielectric stack, wherein the plurality of memory strings each comprises: a core filling film in a center; a channel layer surrounding the core filling film; and a memory film surrounding the channel layer.

In some embodiments, forming the plurality of memory strings comprises forming the plurality of memory strings on opposite sides of the first dielectric staircase structure and the second dielectric staircase structure.

In some embodiments, forming first staircase structure and the second staircase structure comprises forming the first staircase structure and the second staircase structure in a center location of the alternating dielectric stack.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 10A and 10B illustrate cross-sectional views a 3D memory structure at certain process step, according to some embodiments of the present disclosure.

FIGS. 14A and 14B illustrate cross-sectional views a 3D memory structure at certain process step, according to some embodiments of the present disclosure.

Figure 1:
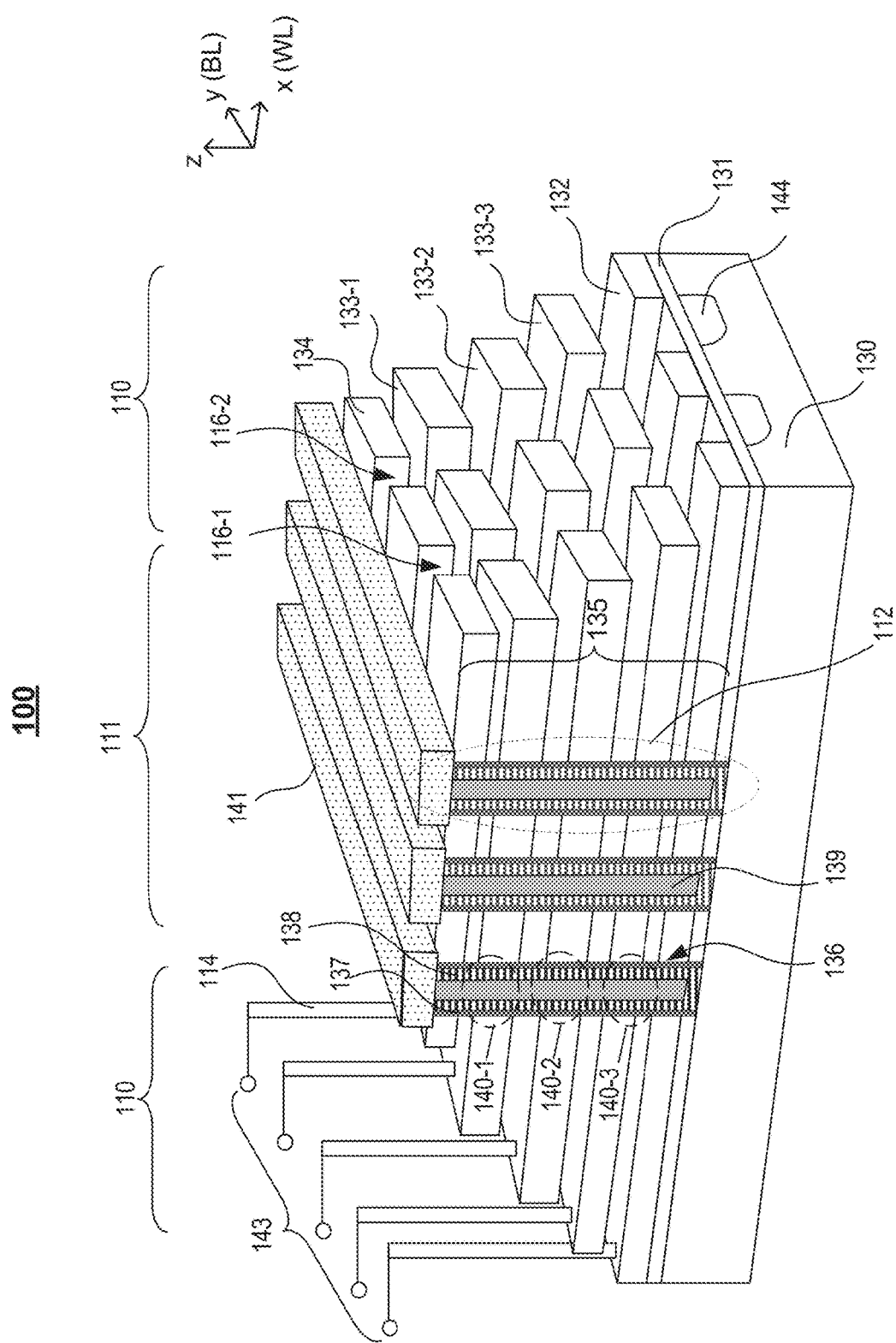
FIG. 1 illustrates a schematic perspective of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The front surface of the substrate is typically where a semiconductor device is formed, and therefore the semiconductor device is formed at a top side of the substrate unless stated otherwise. The bottom surface is opposite to the front surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a perspective view of a portion of an exemplary three-dimensional (3D) memory array structure 100, according to some existing 3D NAND memory. The memory array structure 100 includes a substrate 130, an insulating film 131 over the substrate 130, a tier of bottom select gates (BSGs) 132 over the insulating film 131, and a plurality of tiers of control gates 133, also referred to as "word lines" (WLs) stacking on top of the BSGs 132 to form a film stack 135 of alternating conductive and dielectric layers. The dielectric layers adjacent to the tiers of control gates are not shown in FIG. 1 for clarity.

The control gates of each tier are separated by slit structures 116-1 and 116-2 through the film stack 135. The memory array structure 100 also includes a tier of top select gates (TSGs) 134 over the stack of control gates 133. The stack of TSGs 134, control gates 133 and BSGs 132 is also referred to as "gate electrodes." The memory array structure 100 further includes memory strings 112 and doped source line regions 144 in portions of substrate 130 between adjacent BSGs 132. Each memory strings 112 includes a channel hole 136 extending through the insulating film 131 and the film stack 135 of alternating conductive and dielectric layers, Memory strings 112 also includes a memory film 137 on a sidewall of the channel hole 136, a channel layer 138 over the memory film 137, and a core filling film 139 surrounded by the channel layer 138. A memory cell 140 can be formed at the intersection of the control gate 133 and the memory string 112. A portion of the channel layer 138 underneath the control gate 133 is also referred to as the channel of the memory cell 140. The memory array structure 100 further includes a plurality of bit lines (BLs) 141 connected with the memory strings 112 over the TSGs 134. The memory array structure 100 also includes a plurality of metal interconnect lines 143 connected with the gate electrodes through a plurality of contact structures 114. The edge of the film stack 135 is configured in a shape of staircase to allow an electrical connection each tier of the gate electrodes.

To pursue higher storage capacity in a 3D memory, the number of memory cells and the dimensions of memory blocks have been increased greatly. As a result, the distance from the memory cells in the middle of each memory block to the contact structures at the end of word lines also increases, leading to larger parasitic resistance and slower read/write speed. To resolve this issue, staircase structures (SS) can be formed in the middle regions of each memory block, where a set of contact structures and metal interconnect lines can be formed for each set of staircase structure. However, to form electrical connections between the word lines located in the middle regions of the memory blocks and word-liner driver circuits located in the peripheral region, layout of metal interconnect lines is complicated and can induce routing congestion and increase manufacturing cost.

In FIG. 1, for illustrative purposes, three tiers of control gates 133-1, 133-2, and 133-3 are shown together with one tier of TSG 134 and one tier of BSG 132. In this example, each memory string 112 can include three memory cells 140-1, 140-2 and 140-3, corresponding to the control gates 133-1, 133-2 and 133-3, respectively. The number of control gates and the number of memory cells can be more than three to increase storage capacity. The memory array structure 300 can also include other structures, for example, TSG cut structures, common source contacts and dummy memory strings, etc. These structures are not shown in FIG. 1 for simplicity.

Different from FIG. 1, in the 3D NAND memory provided by the present disclosure, the staircase structure can also be configured in the non-edge locations of the film stack 135, such as located in a center region of the film stack 135 or in a center region of the memory array. The disclosed center staircase structure scheme can provide reduced routing congestion and better area efficiency. The number of metal interconnect layers and manufacturing cost can therefore be reduced. The word line (WL) resistor-capacitor (RC) time can also be reduced to enable faster performance. Further, a staircase bridge scheme is used to realize center staircase structures with excellent area efficiency. In addition, a bottom select gate (BSG) cut scheme allows channel boost for unselected BSG in selected memory block, which can reduce read disturb and consumed power.

Since the staircase bridge needs to cover all word line tiers, it cannot be very narrow. A increased width of the staircase bridge can also reduce extra resistance which is beneficial to array timing. However, the BSG layer is at the bottom of WL tiers and may be partially or fully covered by the staircase bridge depending on the number of BSG cut structures. In some existing fabricating methods, the BSG contacts are formed using back-side metal (e.g., by employing one more metal layers) and require through-silicon-contact (TSC) processing. This involves more complex processing at higher cost. Therefore, the present disclosure introduce novel patterning of the BSG layer to create sufficient spaces for front-side BSG contacts. This novel approach requires less processing steps and fewer metal layers.

Figure 2:
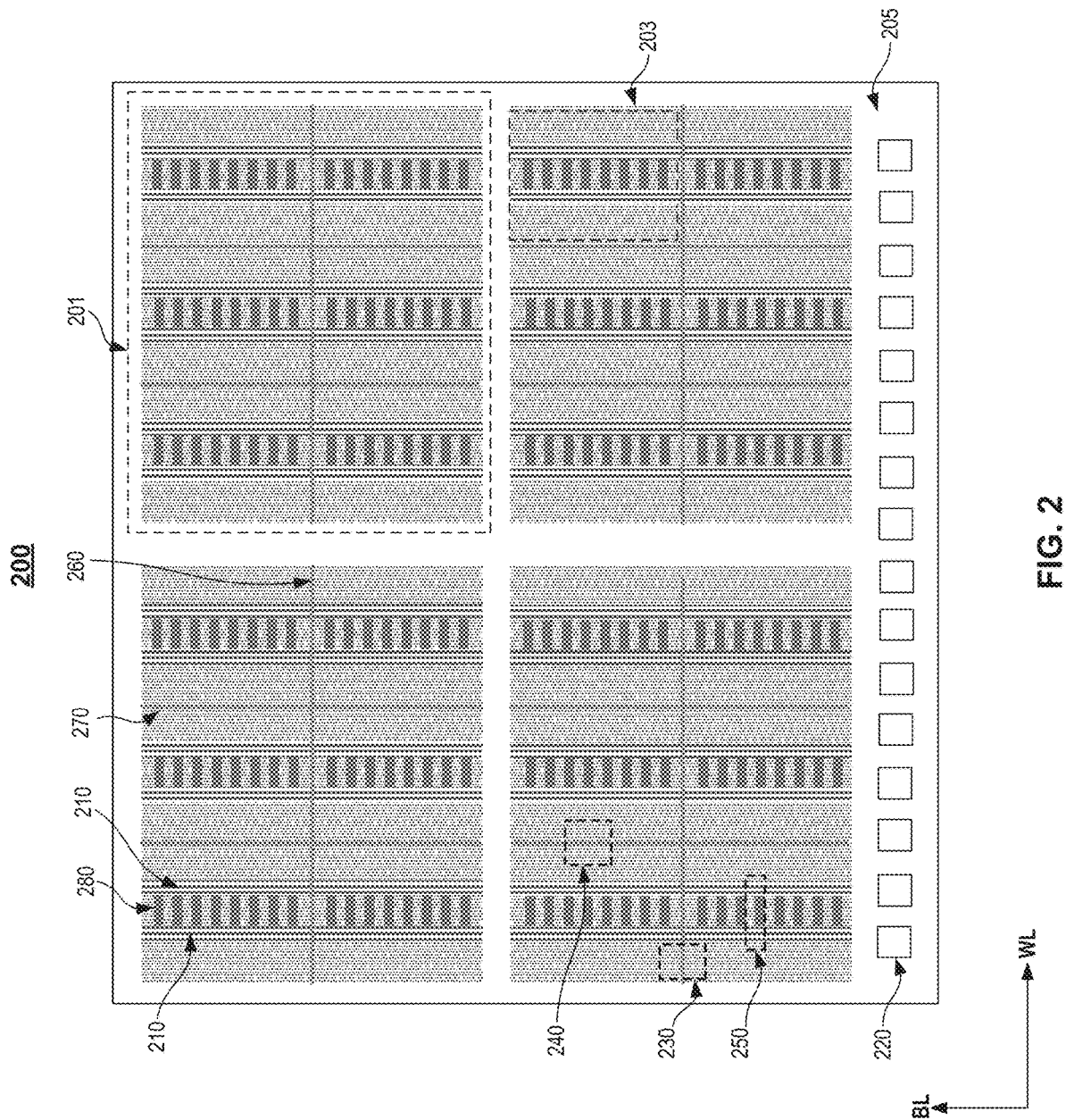
FIG. 2 illustrates a schematic top-down view of a region of 3D memory die, according to some embodiments of the present disclosure.

FIG. 2 illustrates a schematic diagram of an exemplary three-dimensional (3D) memory device 200 in a plan view, according to some embodiments of the present disclosure. The 3D memory device 200 can be a memory chip (package), a memory die or any portion of a memory die, and can include one or more memory planes 201, each of which can include a plurality of memory blocks 203. Identical and concurrent operations can take place at each memory plane 201. The memory block 203, which can be megabytes (MB) in size, is the smallest size to carry out erase operations.

Shown in FIG. 2, the exemplary 3D memory device 200 includes four memory planes 201 and each memory plane 201 includes six memory blocks 203. In this disclosure, memory block 203 is also referred to as a "memory array" or "array." The memory array is the core area in a memory device, performing storage functions. Each memory block 203 can include a plurality of memory cells (e.g., memory cells 140-1, 140-2 and 140-3 in FIG. 1), where each memory cell can be addressed through interconnections such as bit lines and word lines. The bit lines (BLs) and word lines (WLs) can be laid out perpendicularly (e.g., in rows and columns, respectively, as show in FIG. 1), forming an array of metal lines. The direction of bit lines and word lines are labeled as "BL" and "WL" in FIG. 2.

As described above, to pursue higher storage capacity in a 3D memory, the number of memory cells and the dimensions of memory block 203 have been increased greatly. As a result, the distance from the memory cells in the middle of the memory block 203 to the contact structures at the end of word lines also increases, leading to larger parasitic resistance and slower read/write speed. To resolve this issue, staircase structures (SS) 210 can be formed in the middle region of the memory block 203. As shown in FIG. 2, two staircase structures (SS) 210 can be located in the middle region of the memory block 203 and extend along the BL direction.

In some embodiments, the contact structures can include one or more BL contact regions 260 that are sandwiched by two neighboring memory blocks 203 in the BL direction and extended along the WL direction of the 3D memory device, one or more WL contact regions 270 that are sandwiched by two neighboring memory blocks 203 in the WL direction and extended along the BL direction, and one or more bottom select gate (BSG) contact regions 280 that are sandwiched by two neighboring center staircase structures (SS) 210 in the BL direction.

The 3D memory device 200 also includes a periphery region 205, an area surrounding memory planes 201. The periphery region 205 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art example, in some embodiments, 3D memory device 200 can include a plurality of contact pads 220 arranged in a row in the periphery region 205. Interconnect contact can be used for electrically interconnect 3D memory device 200 to any suitable device and/or interface that provide driving power, receive control signal, transmit response signal, etc.

It is noted that, the arrangement of the memory planes 201 in the 3D memory device 200 and the arrangement of the memory blocks 203 in each memory plane 201 illustrated in FIG. 2 are only used as an example, which does not limit the scope of the present disclosure.

Figure 3:
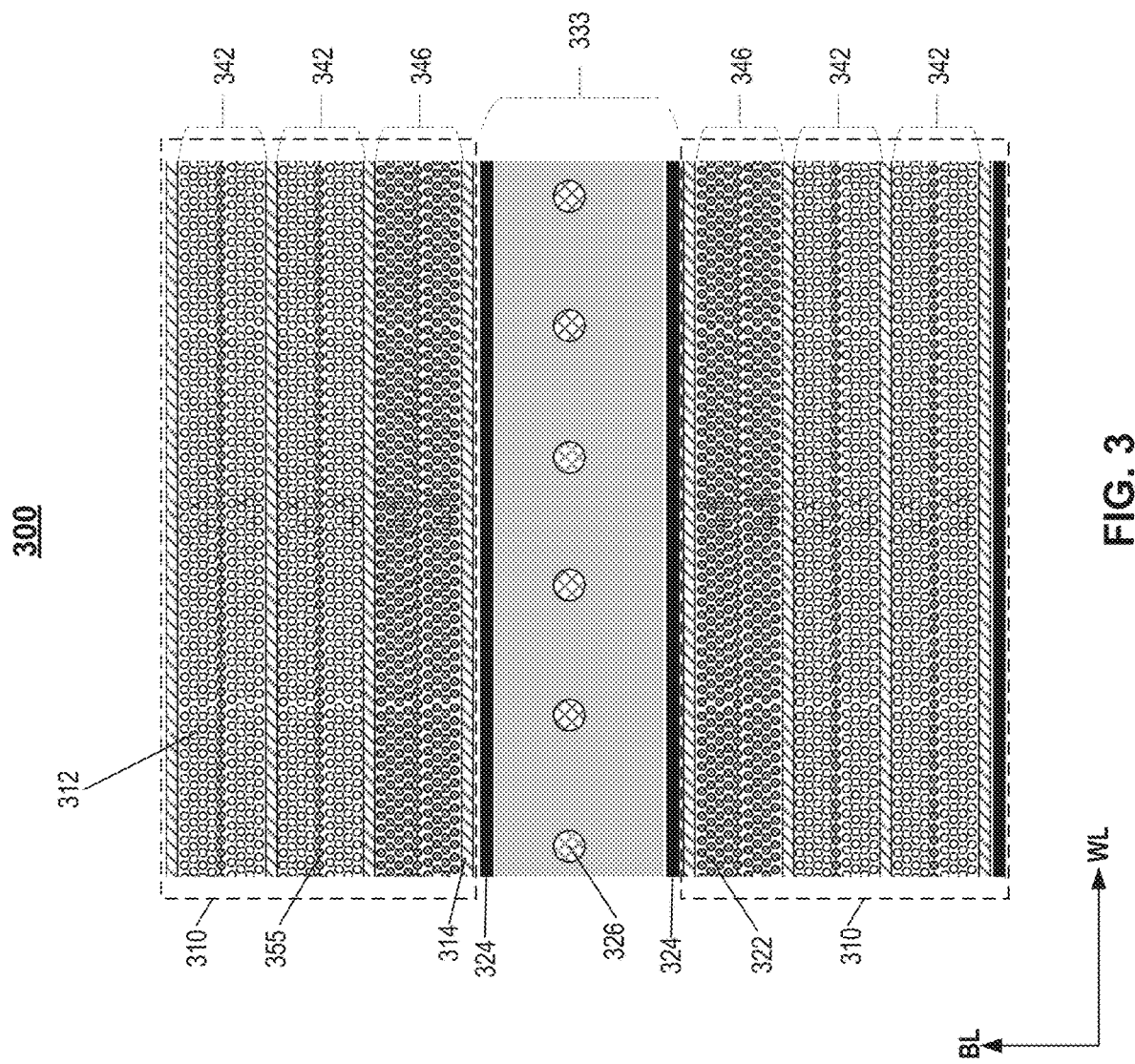
FIG. 3 illustrates a schematic top-down view of a portion of an exemplary 3D memory array structure, in accordance with some embodiments of the present disclosure.
Figure 4:
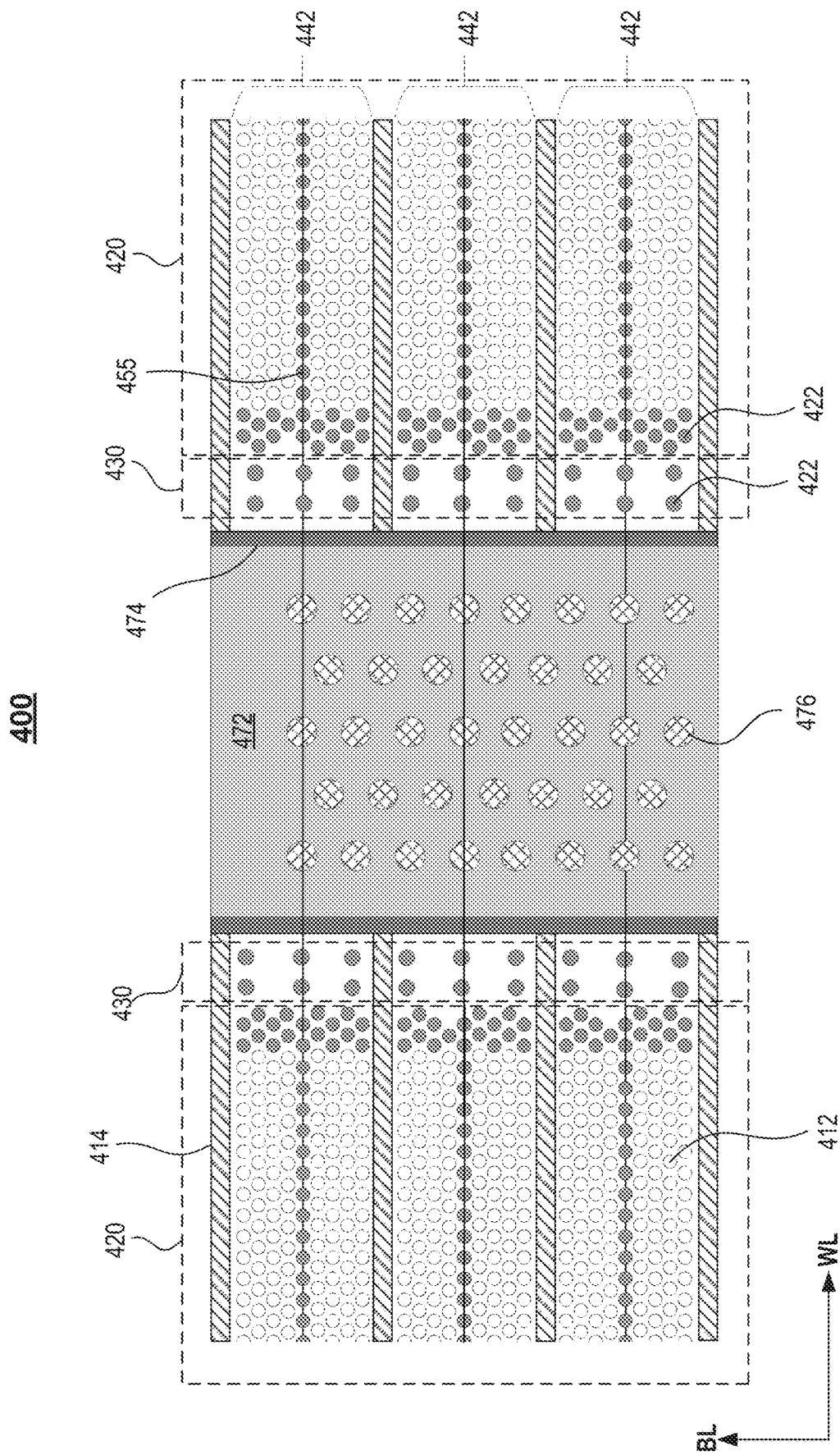
FIG. 4 illustrates a schematic top-down view of a portion of an exemplary 3D memory structure, according to some embodiments of the present disclosure.
Figure 5:
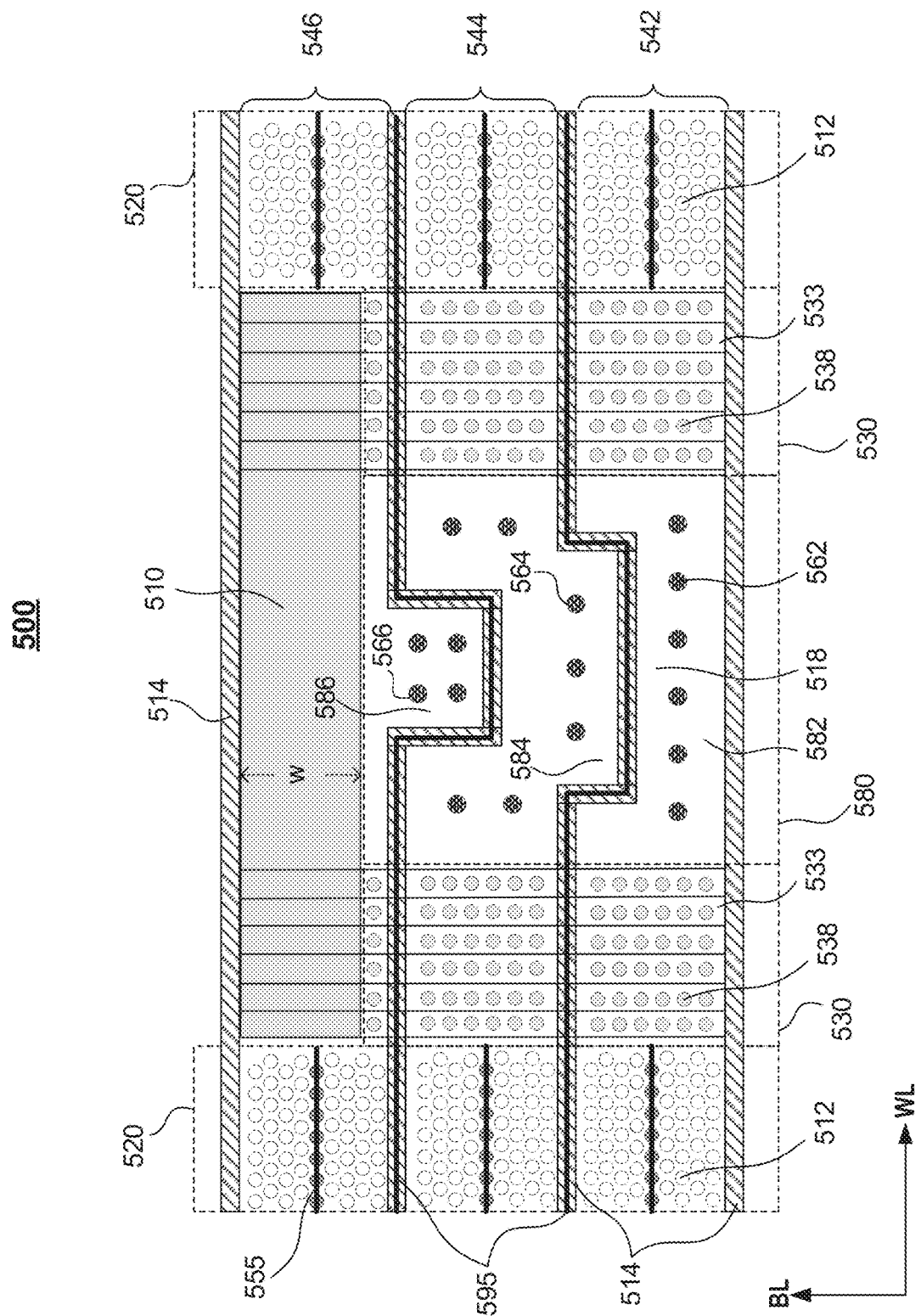
FIG. 5 illustrates a top-down view of a portion of an exemplary 3D memory structure, according to some embodiments of the present disclosure.
Figure 6:
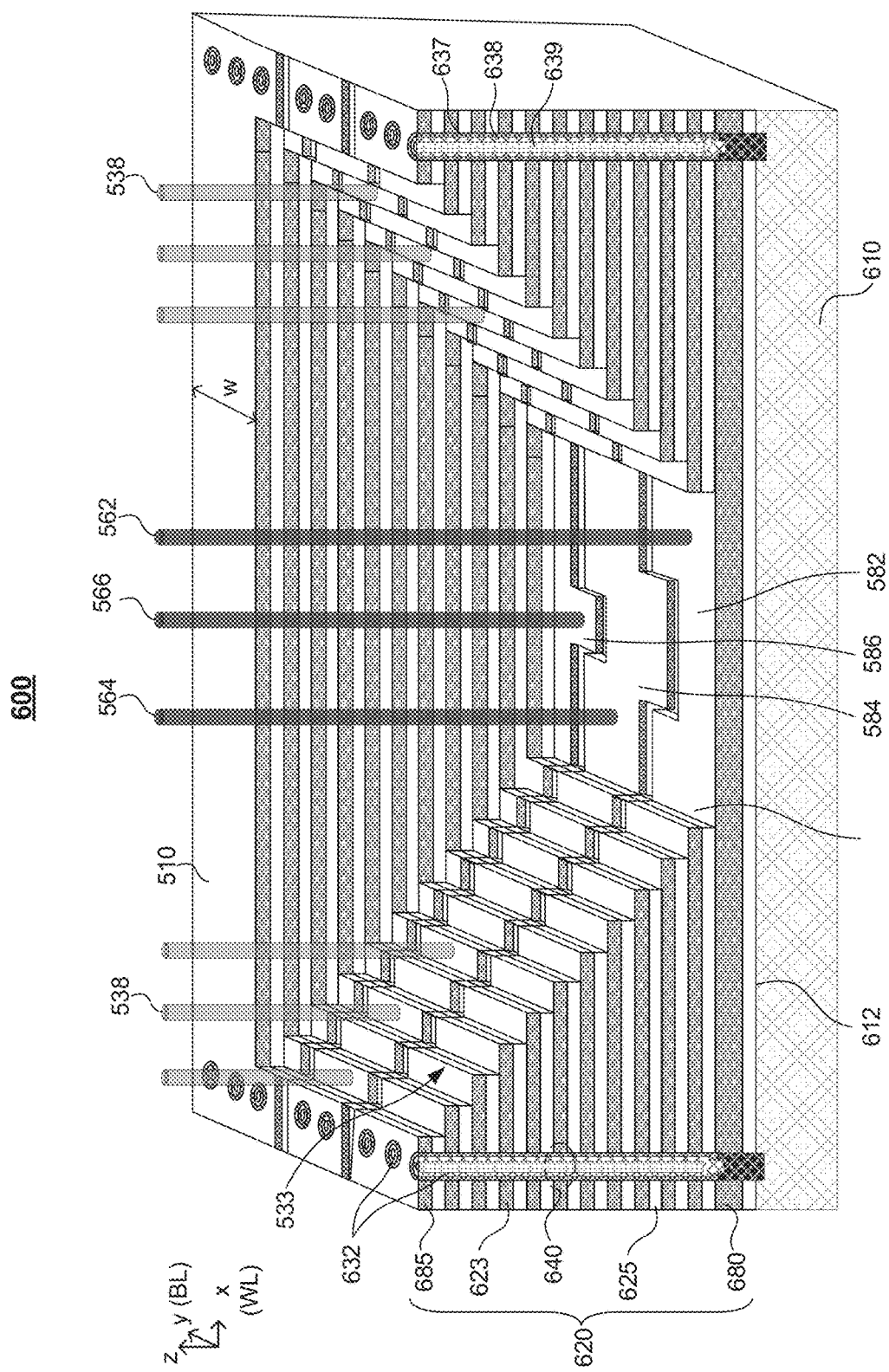
FIG. 6 illustrates a perspective view of the portion of the exemplary 3D memory structure in FIG. 5, according to some embodiments of the present disclosure.
Figure 7:
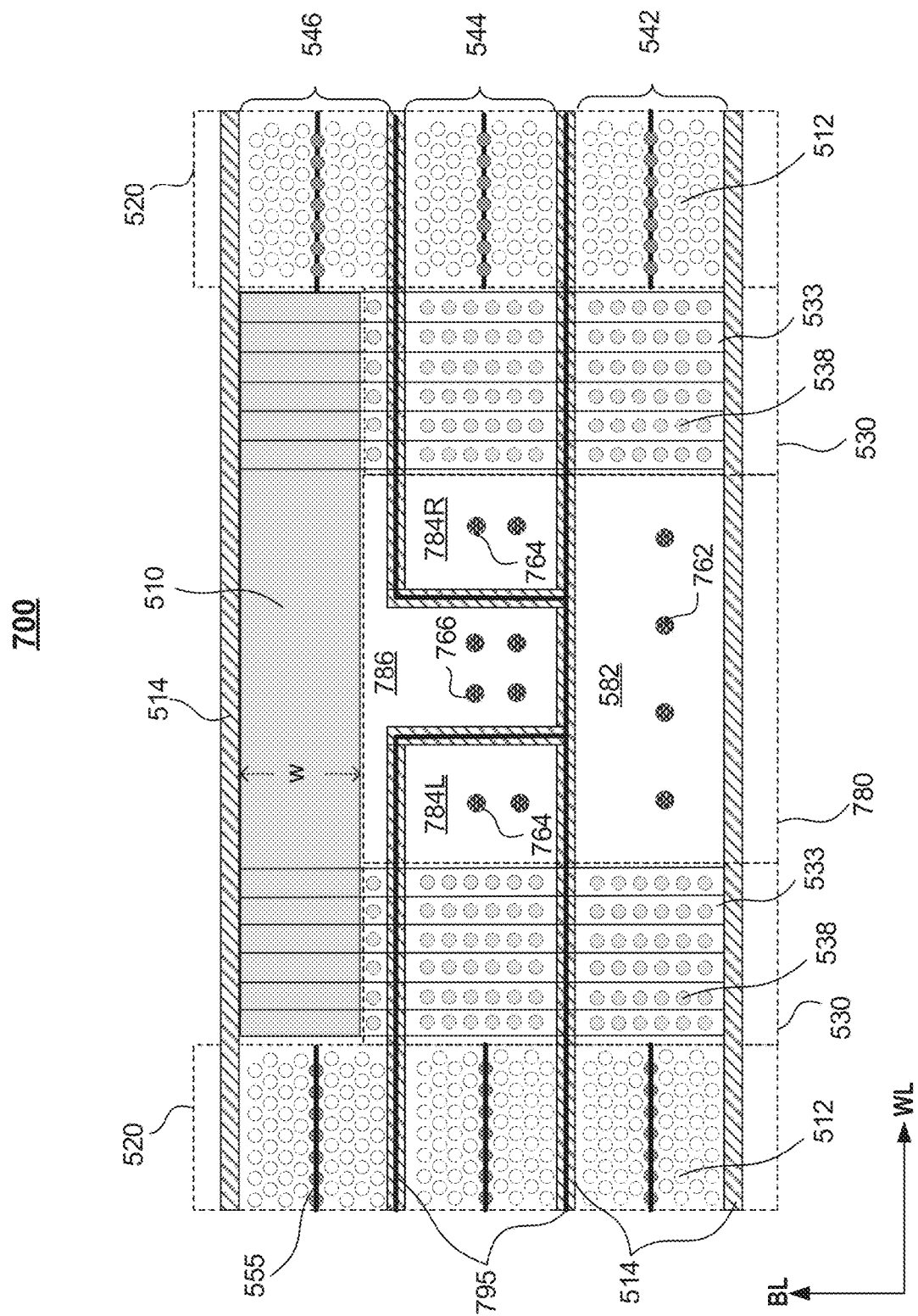
FIG. 7 illustrates a top-down view of a portion of an exemplary 3D memory structure, according to some embodiments of the present disclosure.
Figure 8:
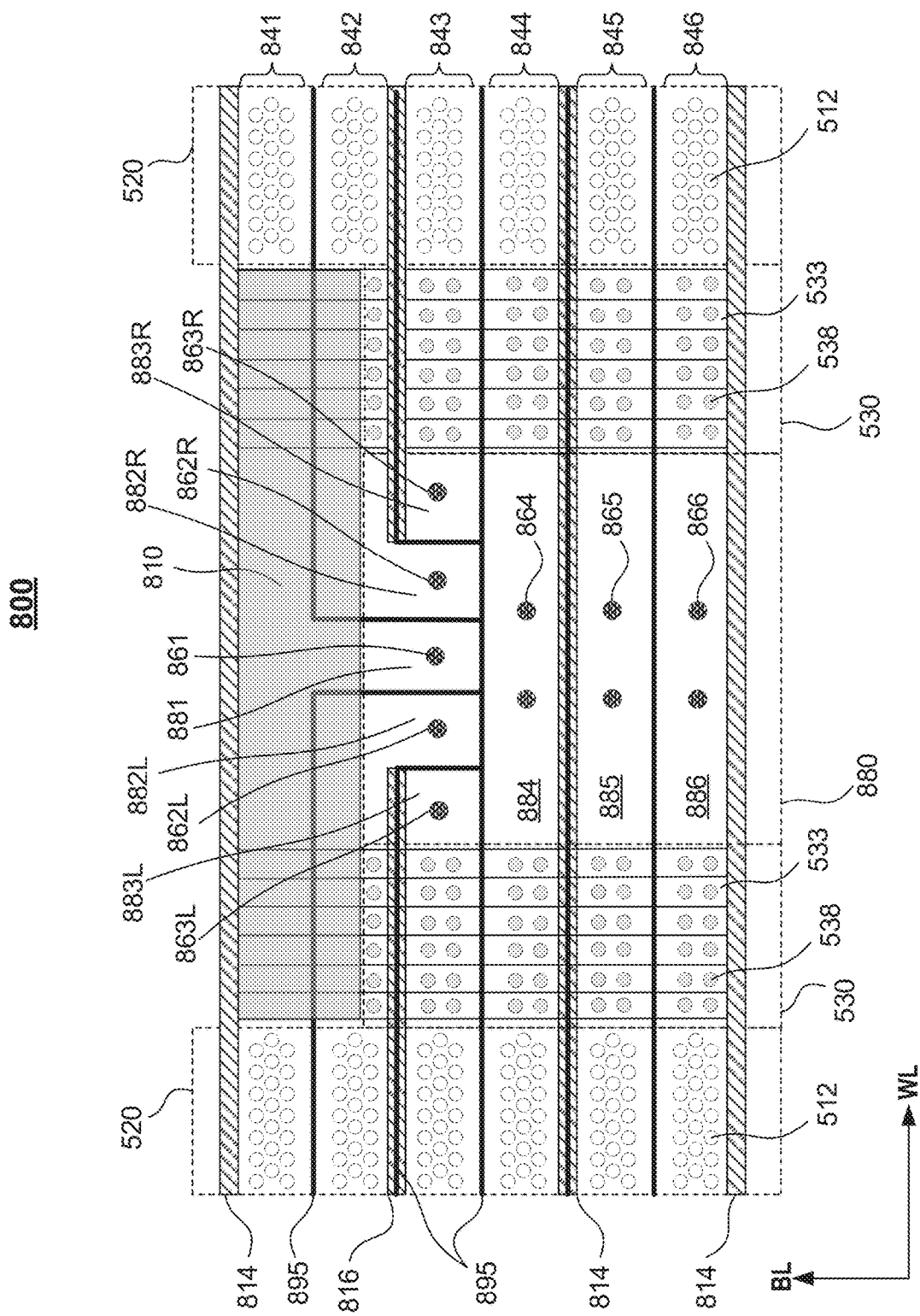
FIG. 8 illustrates a top-down view of a portion of an exemplary 3D memory structure, according to some embodiments of the present disclosure.

FIG. 3 depicts an enlarged plan view of the region 230 shown in FIG. 2 including an exemplary BL contact region 260 of the 3D memory device. FIG. 4 depicts an enlarged plan view of the region 240 shown in FIG. 2 including an exemplary WL contact regions 270 of the 3D memory device. FIGS. 5, 7 and 8 depict enlarged plan views of exemplary configurations of the regions 250 shown in FIG. 2 including exemplary BSG contact regions 280 of the 3D memory device according to various embodiments of the present disclosure. FIG. 6 depict a perspective view of an portion of the exemplary three-dimensional (3D) memory array structure 500 as shown in FIG. 5.

Referring to FIG. 3, an enlarged plan view of the region 230 shown in FIG. 2 including an exemplary BL contact region of the 3D memory device is illustrated according to some embodiments of the present disclosure. The region 300 of the 3D memory device (i.e., region 230 as shown in FIG. 2) can include two channel structure regions 310 (e.g., neighboring memory blocks 203 in BL direction) and a BL contact region 233 (e.g., BL contact region 260 as shown in FIG. 2).

Channel structure regions 310 can include an array of channel structures 312, each is part of a NAND string including a plurality of stacked memory cells. Channel structures 312 extend through a plurality of conductive layer and dialectic layer pairs that are arranged along a direction that is perpendicular to the plan view, which is also referred as a direction that is perpendicular to the surface of the substrate of the 3D memory device, and/or a "vertical direction."

The plurality of conductor/dielectric layer pairs are also referred to herein as an "alternating conductor/dielectric stack." The number of the conductor/dielectric layer pairs in alternating conductor/dielectric stack (e.g., 32, 64, 96, or 128) can set the number of memory cells in 3D memory device 300. Conductive layers and dielectric layers in alternating conductor/dielectric stack alternate in the vertical direction. In other words, except the ones at the top or bottom of alternating conductor/dielectric stack, each conductive layer can be adjoined by two dielectric layers on both sides, and each dielectric layer can be adjoined by two conductive layers on both sides. Conductive layers can include conductive materials including, but not limited to, tungsten (W), cobalt (Co), copper (Cu), aluminum (Al), polycrystalline silicon (polysilicon), doped silicon, silicides, or any combination thereof. Dielectric layers can include dielectric materials including, but not limited to, silicon oxide, silicon nitride, silicon oxynitride, or any combination thereof. In some embodiments, conductive layers include metal layers, such as W, and dielectric layers include silicon oxide.

In some embodiments, BL contact region 333 can be sandwiched by two neighboring channel structure regions 310 in BL direction, and can extend in WL direction. BL contact region 333 can be defined by a barrier structure 324 in conjunction with the edges of BL contact region 333 of the 3D memory device. Multiple contact structures 326 can be formed in BL contact region 333, which is enclosed laterally by barrier structure 324 and the edges of BL contact region 333. In some embodiments, multiple contact structures 326 in BL contact region 333 can penetrate an alternating dielectric stack for switch routing and for reducing bit line capacitance.

The alternating dielectric stack can include a plurality of dielectric layer pairs that are arranged along the vertical direction that is perpendicular to the surface of the substrate of the 3D memory device. Each dielectric layer pair includes a first dielectric layer and a second dielectric layer that is different from first dielectric layer. In some embodiments, first dielectric layer and second dielectric layer each includes silicon nitride and silicon oxide. First dielectric layers in alternating dielectric stack can be the same as dielectric layers in the alternating conductor/dielectric stack described above. In some embodiments, the number of dielectric layer pairs in the alternating dielectric stack is the same as the number of the conductor/dielectric layer pairs in the alternating conductor/dielectric stack in the vertical direction.

As shown in FIG. 3, each channel structure region 310 can include one or more slit structures 314 each extending in WL direction. At least some slit structures 314 can function as the common source contact for an array of channel structures 312 in channel structure regions 310. Slit structures 314 can also divide the 3D memory device into multiple memory fingers 342 and/or dummy memory fingers 346. In some embodiments, each memory finger 342 can share a bottom select gate (BSG) which will described in detail below. A top select gate (TSG) cut structure 355 can be disposed in the middle of each memory finger 342 to divide the top select gate (TSG) of each memory finger 342 into two portions. The top select gate cut structure 355 can extended in an upper portion alternating dielectric stack, and can include dielectric materials including, but not limited to, silicon oxide, silicon nitride, silicon oxynitride, or any combination thereof.

In some embodiments, dummy channel structures 322 are formed in part of channel structure regions 310, for example, in dummy memory fingers 346 that are adjacent to BL contact region 333 in BL direction. Dummy channel structures 322 can provide mechanical support for the memory array structures. Dummy memory fingers 346 do not have memory functions, and thus bit lines and related interconnect lines are not formed in dummy memory fingers 346.

Referring to FIG. 4, an enlarged plan view of the region 240 shown in FIG. 2 including an exemplary WL contact region of the 3D memory device is illustrated according to some embodiments of the present disclosure. The region 400 of the 3D memory device (i.e., region 240 as shown in FIG. 2) can include channel structure regions 420, a WL contact region 472 (e.g., WL contact region 270 as shown in FIG. 2), and top select gate (TSG) staircase regions 430.

As shown in FIG. 4, channel structure regions 420 can include an array of channel structures 412, each including a plurality of stacked memory cells. TSG staircase regions 430 can be disposed on the sides of channel structure regions 420 and adjacent to WL contact region 472 in the plan view. That is, WL contact region 472 is sandwiched by two TSG staircase regions 430 in WL direction. WL contact region 472 can be defined by a barrier structure 424. Multiple contact structures 426 used for switch routing and for reducing word line capacitance can be formed in WL contact region 472, which is enclosed laterally by barrier structure 424.

In some embodiments, dummy channel structures 422 are formed outside WL contact region 472 to provide mechanical support for the memory array structures. It is understood that dummy channel structures 422 can be formed in any regions outside WL contact region 472, for example, in TSG staircase regions 430, and along the edges of channel structure regions 420 adjacent to TSG staircase regions 430. It is noted that, channel structures 412 and dummy channel structures 422 penetrate the alternating conductor/dielectric stack, while contact structures 426 penetrate the alternating dielectric stack.

In some embodiments, a plurality of slit structures 414 each extending in WL direction can divide the 3D memory device into multiple memory fingers 442. At least some slit structures 414 can function as the common source contact for an array of channel structures 412 in channel structure regions 420. Sidewalls of slit structures 414 can include dielectric materials including, but not limited to, silicon oxide, silicon nitride, silicon oxynitride, or any combination thereof. Filling material of slit structures 414 can include conductive materials including, but not limited to, tungsten (W), cobalt (Co), copper (Cu), aluminum (Al), polycrystalline silicon (polysilicon), doped silicon, silicides, or any combination thereof.

A top select gate cut structure 455 can be disposed in the middle of each memory finger 442 to divide the top select gate (TSG) of the memory finger into two portions. The top select gate cut 455 can include dielectric materials including, but not limited to, silicon oxide, silicon nitride, silicon oxynitride, or any combination thereof.

In some embodiments, WL contact region 472 can be sandwiched by two neighboring TSG staircase regions 430 in WL direction, and can extend in BL direction. WL contact region 472 can be defined by a barrier structure 474 in conjunction with the edges of WL contact region 472 of the 3D memory device. Multiple contact structures 476 can be formed in WL contact region 472; which is enclosed laterally by barrier structure 474 and the edges of WL contact region 472. In some embodiments, multiple contact structures 476 in WL contact region 472 can penetrate an alternating dielectric stack for switch routing and for reducing word line capacitance.

It is noted that, the barrier structure 474 in BL direction can cross the slit structures 414. As such, the conductive layers in channel structure regions 420 in memory fingers 442 can be electrically blocked by barrier structure 474. Therefore, the top select gates (TSG) of channel structures 412 between two channel structure regions 420 in memory fingers 442 on both side of WL contact region 472 are not interconnected by the top conductive layers in the alternating conductor/dielectric stack. To interconnect the top select gates of channel structures 412 between two channel structure regions 420 in each memory finger 442 on both side of WL contact region 472, TSG staircase regions 430 can include one or more conductive lines (not shown in FIG. 4) formed on a staircase structure (e.g., within top two to four levels) for making electrical interconnections with the top select gates (TSG) of channel structures 412 between two channel structure regions 420 in each memory finger 442 that are separated by WL, contact region 472.

For example, slit structures 414 that are cut off by WL contact region 472 can extend into TSG staircase regions 430. The top two conductive layers in the alternating conductor/dielectric stack can have a single-side staircase structure. One or more interconnection layers with contacts can be formed on the single-side staircase structure to provide electrical interconnection between the top select gates of channel structures 412 in channel structure regions 420 and in memory finger 442 that are separated by WL contact region 472.

Referring to FIG. 5, an enlarged plan view of the region 250 shown in FIG. 2 including an exemplary BSG contact region of the 3D memory device is illustrated according to some embodiments of the present disclosure. FIG. 6 illustrates a perspective view of the region of the 3D memory device as shown in FIG. 5, according to some embodiments of the present disclosure.

As shown in FIG. 5, the region 500 of the 3D memory device (i.e., region 250 as shown in FIG. 2) can include channel structure regions 520, staircase bridge region 510, center staircase regions 530, and at least one bottom select gate (BSG) contact region 580.

In some embodiments, at least two center staircases regions 530 of the 3D memory structure 500 can be arranged in the middle of the memory block 203, as shown in HQ's, 2, 5 and 6. A plurality of staircases 533 can be arranged along the WL direction, and each staircase 533 is extended along the BL direction. The channel structure regions 520 can be arranged on both sides of the center staircases regions 530 along the BL direction. The staircase bridge region 510 can be arranged on one side of the center staircases regions 530 along the WL direction. The at least one BSG contact region 580 can be sandwiched between the at least two center staircases regions 530 in the WL direction.

Referring to FIG. 6, the 3D memory structure 600 includes a substrate 610 and an alternating conductor/dielectric: stack 620 including a plurality of alternating conductive and dielectric layers disposed on the substrate 610. In some embodiments, the substrate 610 can provide a platform for forming subsequent structures. In some embodiments, the subsequent structures are formed in a vertical direction (e.g., the z-direction orthogonal to a front surface 612 of substrate 610). In FIG. 6, the x- and y-directions are along a plane parallel to the front surface 612 of the substrate 600, and are parallel to the respective WL and BL directions.

In some embodiments, the substrate 610 can be any suitable semiconductor substrate having any suitable semiconductor materials, such as monocrystalline, polycrystalline or single crystalline semiconductors. For example, the substrate 610 can include silicon, silicon germanium (SiGe), germanium (Ge), silicon on insulator (SOT), germanium on insulator ((301), gallium arsenide (GaAs), gallium nitride, silicon carbide, compound, or any combinations thereof. In some embodiments, the substrate 610 can include a layer of semiconductor material formed on a handle wafer, for example, glass, plastic, or another semiconductor substrate.

The front surface 612 of the substrate 1010 is also referred to as a "main surface" or a "top surface" of the substrate 610 herein. Layers of materials can be disposed on the front surface 612 of the substrate 610. A "topmost" or "upper" layer is a layer farthest or farther away from the front surface 612 of the substrate 610. A "bottommost" or "lower" layer is a layer closest or closer to the front surface 612 of the substrate 600.

In some embodiments, the alternating conductor/dielectric stack 620 includes a plurality of conductive layers 623 and dielectric layers 625 alternatingly stacked on top of each other. The alternating conductor/dielectric stack 620 can extend in a lateral direction parallel to the front surface 612 of the substrate 610, while the conductive layers 623 and the dielectric layers 625 can alternate in the vertical direction. In other words, except the one at the bottom of the alternating conductor/dielectric stack 620, each conductive layer 623 can be sandwiched by two dielectric layers 625, and each dielectric layer 625 can be sandwiched by two conductive layers 623. The conductive layers 623 can each have the same thickness or have different thicknesses. Similarly, the dielectric layers 625 can each have the same thickness or have different thicknesses. In some embodiments, the conductive layers 623 can include conductor materials such as W, Co, Cu, Al, Ti, Ta, TiN, TaN, Ni, doped silicon, silicides (e.g., Ni Six, WSix, CoSix, Ti Six) or any combination thereof. The dielectric layers 625 can include dielectric materials such as silicon oxide, silicon nitride, silicon oxynitride, or any combination thereof. In some embodiments, the dielectric layers 625 can also include high-k dielectric materials, for example, hafnium oxide, zirconium oxide, aluminum oxide, tantalum oxide, lanthanum oxide, and/or any combination thereof.

In some embodiments, the dielectric layers 625 can have the same thickness or have different thicknesses. Example thicknesses of the dielectric layers 625 can range from 10 nm to 500 nm, preferably about 25 nm. Similarly, the conductive layers 623 can have the same thickness or have different thicknesses. Example thicknesses of the conductive layers 623 can range from 10 nm to 500 nm, preferably about 35 nm. In some embodiments, the bottom conductive layer 680 can have a larger thickness, and can be used as one or more bottom select gates (BSGs). In some embodiments, top few conductive layers can be used as top select gates (TSGs). It should be understood that the numbers of conductive layers 623 and dielectric layers 625 in FIG. 6 are for illustrative purposes only and that any suitable number of layers can be included in the alternating conductor/dielectric stack 620. In some embodiments, the alternating conductor/dielectric stack 620 can include layers in addition to the conductive layers 623 and the dielectric layers 625, and can be made of different materials and/or with different thicknesses.

In some embodiments, the 3D memory structure 500 (in FIG. 5) or 600 (in FIG. 6) can also include a plurality of memory cells 640 vertically stacked as memory strings 632 (also referred as channel structures, e.g., channel structures 312, 412 in FIGS. 3 and 4), similar to the memory cells 140 and memory strings 112 in FIG. 1. As shown in FIG. 6, the memory string 632 extends through the alternating conductor/dielectric stack 620, where each memory string 632 can include a core filling film 639, a channel layer 638 and a memory film 637, The center of the channel structures 632 can be the core filling film 639. The channel layer 638 surrounds the core filling film 639, and the memory film 637 surrounds the channel layer 638. In some embodiments, the channel layer 638 includes silicon, such as amorphous silicon, polysilicon, or single crystalline silicon. In some embodiments, the memory film 637 is a composite layer including a tunneling layer, a storage layer (also known as "charge trap/storage layer"), and a tunneling blocking layer. Each memory string 632 can have a cylinder shape (e.g., a pillar shape). In some embodiments, the channel layer 638, the tunneling layer, the storage layer, and the tunneling blocking layer can be arranged along a direction from the center toward the outer surface of the pillar in this order. The tunneling layer can include silicon oxide, silicon nitride, or any combination thereof. The tunneling blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 637 includes ONO dielectrics (e.g., a tunneling layer including silicon oxide, a storage layer including silicon nitride, and a tunneling blocking layer including silicon oxide).

In some embodiments, the conductive layers 623 can act as the control gates or word lines for the memory cells 340. As described above, the bottom conductive layer 680 can include one or more bottom select gates (BSGs), and the top one or more conductive layers 685 can include one or more top select gates (TSGs). As such, each memory string 632 can include a bottom select gate (e.g., a source select gate) at a lower end (i.e., a source terminal) of the memory string 632 and a top select gate (e.g., a drain select gate) at an upper end (i.e. a drain terminal) of the memory string 632. As used herein, the "upper end" of a component (e.g., memory string 632) is the end further away from the substrate 610 in the vertical direction, and the "lower end" of the component (e.g., memory string 632) is the end closer to the substrate 610 in the vertical direction.

In some embodiments, the 3D memory structure 500 (in FIG. 5) or 600 (in FIG. 6) can include a plurality of staircase 533 in the center staircase regions 530 as shown in FIG. 5, where each of the conductive layer 623 terminates at a different length in the horizontal x-direction as shown in FIG. 6. In some embodiments, the center staircase regions 530 can be disposed anywhere within a memory array. In some embodiments, two or more center staircase regions 530 can be disposed in an inside portion of a memory block 203. In one example, two or more center staircase structures 210 (in FIG. 2) can be placed in the center of a memory block 203. In some embodiments, the memory strings (e.g., channel structures) 512 (in FIG. 5), 632 (in FIG. 6) in the channel structure regions 520 can be distributed on opposite sides of the two or more center staircase regions 530 along BL-direction.

In some embodiments, the two or more staircase regions 530 can include two or more sets of staircases 533 facing each other in WL direction. In some embodiments, a plurality of staircase contacts 538 can be formed on the conductive layer 623 in each staircase 533 respectively. It should be noted that, the arrangement of the plurality of staircase contacts 538 can be design in arbitrary suitable way to achieve electric connection of the plurality of word lines. In one example as shown in FIG. 6, the staircase contacts 538 can be electrically contacted with the odd number of word lines in the left side center staircase region 530, and can be electrically contacted with the even number of word lines in the right side center staircase region 530. As a result, a minimum spacing between staircase contacts 538 on different word lines can be increased (e.g., doubled). Therefore, process window for the staircase contacts 538 can be increased and manufacturing yield can be improved. It is noted that each center staircase region 530 can include any suitable number of staircases 533 and staircase contacts 538. The arrangements and numbers of staircases 533 and staircase contacts 538 as shown in FIGS. 5 and 6 are for illustrative purpose only, but not limited the scope of the present disclosure.

In some embodiments, the 3D memory structure 500 (in FIG. 5) or 600 (in FIG. 6) also includes a staircase bridge 510 that extends along the WL direction parallel to the word lines (e.g., conductive layers 623). In the WL direction, the staircase bridge 510 is longer on top and shorter at bottom, where top and bottom are vertically relative to the distance from the substrate 610 (in z-direction). The staircase bridge 510 has a width w in the BL direction which is less than width of the memory finger 546. The staircase bridge 510 can connect corresponding word lines (e.g., conductive layers 623) between two or more center staircase regions 530. For example, the word lines in different center staircase region 530 formed by the same conductive layer 632 can be electrically connected through corresponding conductive layer in the staircase bridge 510. Thus, for each center staircase region 530, only one set of word line drivers with one set of interconnect metal lines are needed to address each word line, where each word line can be electrically connected to at least one staircase contact (or "WL contact structure") 538 in any one of the center staircase regions 530.

In some embodiments, the staircase bridge 510 can be formed in the alternating conductor/dielectric stack 620 and can include the plurality of conductive layers 623 and dielectric layers 625. In this example, the staircase bridge 510 can be disposed vertically on the staircases 533, where a bottom of the staircase bridge 510 can be in contact with the bottom select gate 586. In some embodiments, the staircase bridge 510 only connects the word lines 623 between the center staircase regions 530. In some embodiments, the staircase bridge 510 can also connect the top select gates 685 between the center staircase regions 530.

In some other embodiments different from the example as shown in FIG. 6, the staircase bridge 510 can include conductive material different from the conductive layers 623. In some other embodiments different from the example as shown in FIG. 6, the staircase bridge 510 can include a thickness different from the conductive layers 623. In some embodiments, the staircase bridge 510 can have a width w smaller than a width of a memory finger 546.

The staircase bridge 510 can be disposed any suitable location between neighboring center staircase regions 530. FIGS. 5 and 6 illustrates the configuration where the staircase bridge 510 is disposed on the memory finger 546, or near an edge of the memory block 203. In some other embodiments not shown in the figures, the staircase bridge 510 can be disposed in another memory finger, e.g., in the memory finger 544 or 542.

In some embodiments, the 3D memory structure 500 (in FIG. 5) or 600 (in FIG. 6) further includes a plurality bottom select gate (BSG) cut structures 595 (in FIG. 5) that can separate the bottom conductive layer 680 into multiple bottom select gate segments (e.g., 582, 584, 586 in FIGS. 5, 6, also referred to as back select gate) that are electrically isolated from each other. The BSG cut structures 595 can include any suitable dielectric material for electrically insulating purpose, including, but not limited to, silicon oxide, silicon nitride, silicon oxynitride, or any combination thereof.

By introducing BSG cut structures 595, a memory block of a 3D memory device (for example the memory block 203 in FIG. 2 and the memory structure 500 in FIG. 5) can have improved bottom select transistors (BSTs) due to reduced parasitic capacitance and coupling effects between the BSG segments and adjacent dielectric layers. In addition, the divided BSG segments allows erasing a specific sub-block rather than the entire memory block 103. Accordingly, the erasing time and data transfer time could be reduced significantly, and data storage efficiency can be improved as well.

To reduce resistance, in some embodiments, the width w of the staircase bridge 510 cannot be designed too small. However, a wider width w of the staircase bridge 510 close to the width of a memory block (e.g., memory block 546) may cause a majority area of one or more BSG segments (e.g., BSG segment 566 in memory finger 546) being covered by the staircase bridge 510, resulting a small process window for forming BSG contacts on the one or more BSG segments. To resolve this issue, the present disclosure provide new design schemes to modify the shapes of BSG segments to allow sufficient process window for forming BSG contacts as described in detail below.

Referring to FIGS. 5 and 6, the BSG cut structures 595 can divide the bottom conductive layer 680 (in FIG. 6) into multiple bottom select gates (e.g., BSG segments 582, 584, 586). In some embodiments as shown in FIG. 5, the BSG cut structures 595 can be located coincident with positions of the slit structure 514. In some other embodiments not shown in the figure, the BSG cut structures 595 can be located at different positions from the slit structure 514. In some embodiments, the BSG cut structures 595 can extend along WL direction in the channel structure regions 520 and the center staircase regions 530, and can include one or more non-linear sections in the at least one bottom select gate (BSG) contact region 580. It is noted that, the one or more non-linear sections of the BSG cut structures 595 can include one or more straight portions that extend along different directions (e.g., WL direction and BL direction) as shown in FIG. 5, or one or more curved portions (not shown), or any other suitable non-linear portions.

By introducing the one or more non-linear sections of the BSG cut structures 595, each of the BSG segments 582, 584, 586 can have a sufficient contact area in the BSG contact regions 280 for configuring one or more BSG contacts. For example, the BSG segment 586 that is partially covered by the staircase bridge 510 can include an extended region in the BL direction that is not covered by the staircase bridge 510, thereby providing sufficient contact area for configuring one or more BSG contacts 566. Therefore, the width w the staircase bridge 510 can be increased to close to the width of memory fingerprint 546 to ensure a reduced resistance and a better electric connection between words lines on both center staircase regions 530.

Similar to FIGS. 3, and 4, in some embodiments, the 3D memory structure 500 can also include one or more top select gate (TSG) cut structures 555, as shown in FIG. 5. The TSG cut structures 555 can be disposed in the middle of each memory finger to divide the top select gate (TSG) of the memory finger into two portions. The top select gate cut structures 555 can include any suitable dielectric material for electrically insulating purpose including, but not limited to, silicon oxide, silicon nitride, silicon oxynitride, or any combination thereof.

In some embodiments, the 3D memory structure 500 (in FIG. 5) or 600 (in FIG. 6) further includes a plurality of contact structures, including staircase contacts 538 (e.g., word line contacts, TSG contacts) in the center staircase regions 530, and BSG contacts 566, 564, 562 in one or more BSG contact regions 580. The top select gates, the word lines and the bottom select gates can be electrically connected with the plurality of contact structures 538, 562, 564, 566. Through the contact structures 538, 562, 564, 566, metal interconnect lines formed at back-end-of-line processes can be electrically connected to each conductive layer 623, 680, 685. Accordingly, by using the center staircase structure, each memory cell in the 3D NAND memory can be controlled by corresponding word line to perform read, write, or erase operation. In some embodiments, the contact structures can include any suitable conductive material, for example, W, Ti, TiN, Cu, TaN, Al, Co, Ni, or any combination thereof.

It is noted that, the 3D memory structure 600 in FIG. 6 can include an insulating structure (omitted in FIG. 6 for simplicity) covering the one or more center staircase regions 530 and the one or more BSG contact regions 580. The insulating structure can include with any suitable dielectric materials such as silicon oxide, silicon nitride, silicon oxynitride, SiOCN, or any combination thereof. The staircase contacts 538 (e.g., word line contacts, TSG contacts) in the center staircase regions 530, and the BSG contacts 566, 564, 562 can penetrate the insulating structure to contact the corresponding conductive layer respectively.

For illustration purpose only, FIG. 5 show two BSG cut structures 595 and three BSG segments 582, 584, 586. It is noted that the BSG cut structures and BSG segments can have any suitable number and have any suitable shapes, which are not limited in the present disclosure. Further, for illustration purpose and simplicity only, FIG. 5 show four BSG contacts 566 that are connected to BSG segment 586, four BSG contacts 564 that are connected to BSG segment 584, and six BSG contacts 562 that are connected to BSG segment 582, while FIG. 6 show one BSG contact 566 that is connected to BSG segment 586, one BSG contact 564 that is connected to BSG segment 584, and one BSG contact 562 that is connected to BSG segment 582. It is noted that the BSG contacts can have any suitable number and be arranged at any suitable locations, which are not limited in the present disclosure.

FIGS. 7 and 8 illustrate enlarged plan views of exemplary regions 250 shown in FIG. 2 including exemplary BSG contact regions 280 of the 3D memory device according to some other embodiments of the present disclosure.

Comparing to the 3D memory structure 500 as shown in FIG. 5, the 3D memory structure 700 as shown in FIG. 7 can have different design of the BSG cut structures 795. Specifically, the BSG cut structures 795 can divided the BSG segments into separated sub-portions along the WL direction. For example, the BSG segments 784L and 784R in the memory finger 544 are separated by the BSG cut structures 795 into two sub-portions, while an extended portion of the BSG segment 786 is sandwiched between the two sub-portions 784L and 784R of BSG segment 784. In such a design, a conductive line in a patterned conductive layer (not shown in FIG. 7) formed above the 3D memory structure 500 can be used to electrically connect to both the two sub-portions 7841, and 784R of BSG segment 784.

Referring to FIG. 8, the 3D memory structure 800 can include six memory sub-fingers 841-846. Each memory finger between neighboring slit structures 814 or 816 can include two sub-fingers that are bounded by TSG cut structures (not shown in FIG. 8). A width of the staircase bridge 810 can be larger than a width of the memory sub-finger 841. In such an example, the BSG cut structures 895 can divided multiple BSG segments into separated sub-portions along the WL direction. For example, BSG segment 882 in the memory finger 842 are separated by the BSG cut structures 895 to sub-portions 882L and 882R, and BSG segment 883 in the memory finger 843 are also separated by the BSG cut structures 895 to sub-portions 883L and 883R. An extended portion of the BSG segment 881 is sandwiched between the two sub-portions 882L and 882R of BSG segment 882, and the two sub-portions 882L and 882R of BSG segment 882 are sandwiched between the two sub-portions 883L and 883R of BSG segment 883. It is noted that, the slit structure 814 includes an opening allowing the extended portions of the BSG segments 881 and 882 to extend into the memory sub-finger 843. In such a design, conductive lines in a patterned conductive layer (not shown in FIG. 8) formed above the 3D memory structure 500 can be used to electrically connect between the two sub-portions 882L and 882R of BSG segment 882, and between the two sub-portions 883L and 883R of BSG segment 883 respectively.

Figure 9:
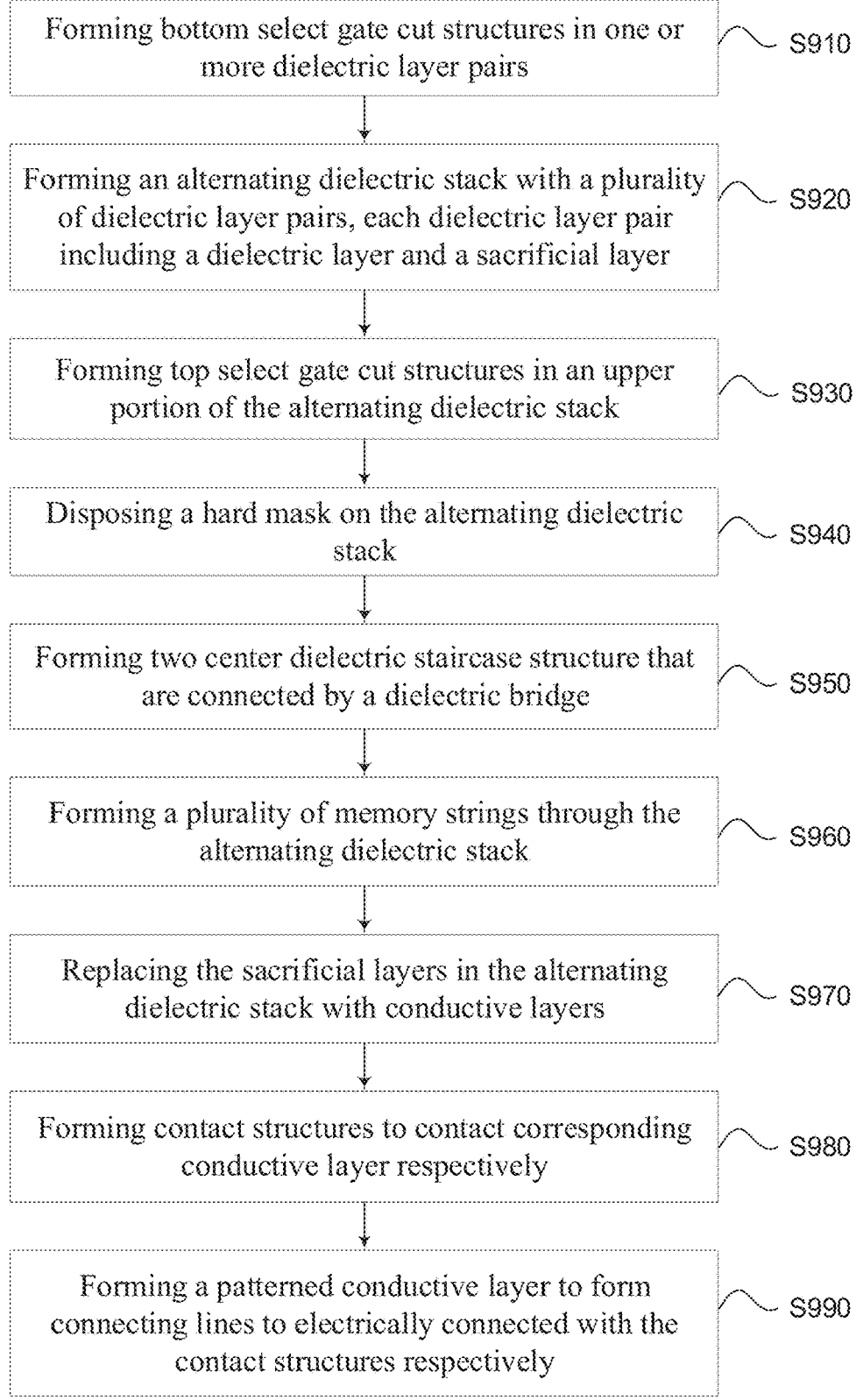
FIG. 9 illustrates a flow diagram of an exemplary method for forming a 3D memory structure in accordance with some embodiments of the present disclosure.

FIG. 9 illustrates an exemplary fabrication process 900 for forming a disclosed 3D memory structure, accordance to some embodiments of the present disclosure. It should be understood that the process steps shown in fabrication process 900 are not exhaustive and that other process steps can be performed as well before, after, or between any of the illustrated process steps. In some embodiments, some process steps of exemplary fabrication process 900 can be omitted or other process steps can be included, which are not described here for simplicity. In some embodiments, process steps of fabrication process 900 can be performed in a different order and/or vary.

FIGS. 10A-10C, 11A-11B, 12A-12B, 13A-13B, 14A-14C, 15A-15B, 16, 17A-17B and 18 are cross-sectional views or top-down views of a 3D memory device at various process steps, according to some embodiments of the present disclosure.

Figure 10C:
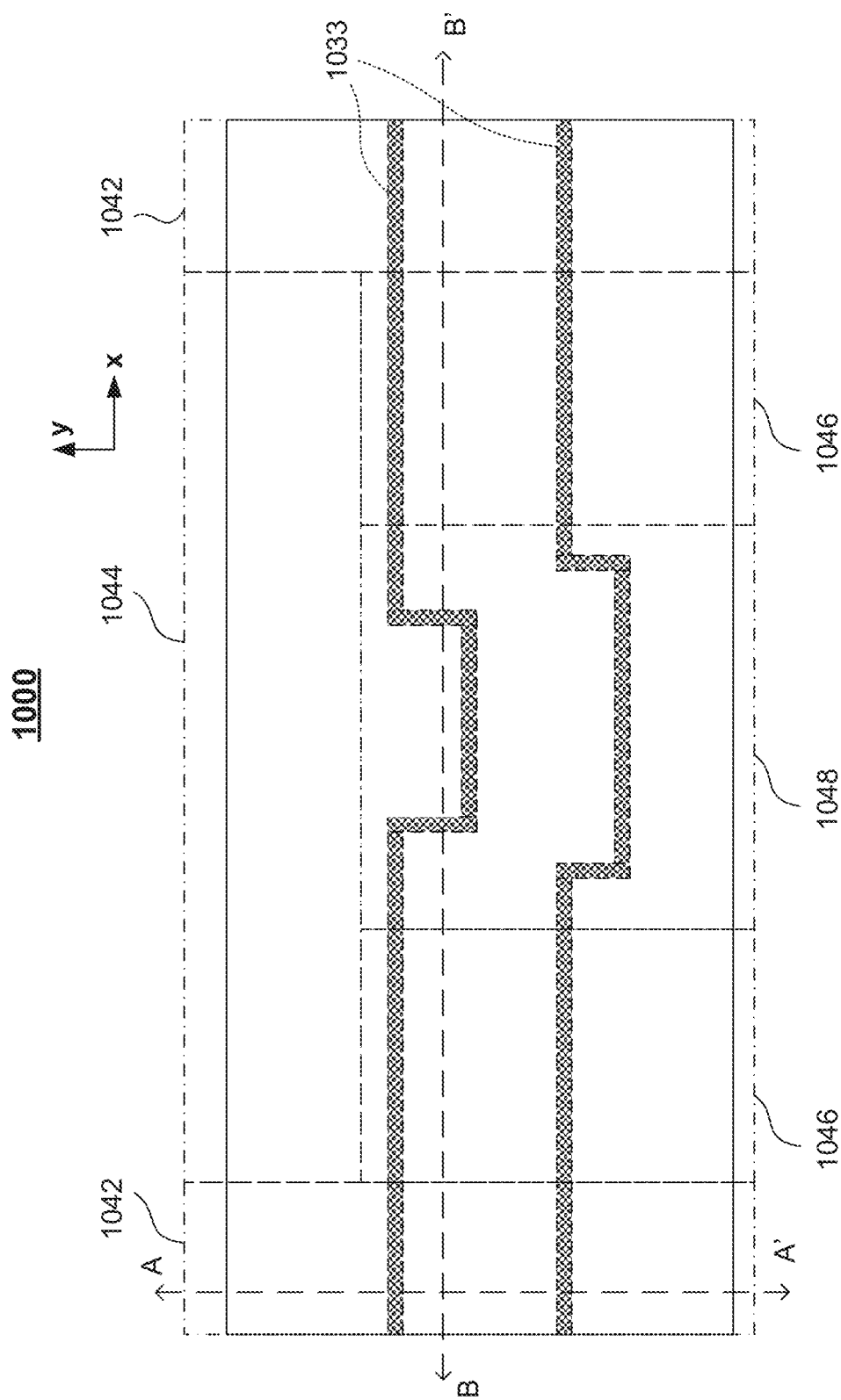
FIG. 10C illustrates a top-down view of the 3D memory, structure in FIGS. 10A and 10B, according to some embodiments of the present disclosure.

As shown in FIG. 9, fabrication process 900 starts at process step S910, in which one or more bottom select gate (BSG) cut structures 1033 can be formed in a bottom dielectric layer pair 1029 on a substrate 1010. FIGS. 10A and 10B illustrate cross-sectional views of an exemplary structure 1000 along x-direction and v-direction, respectively, according to some embodiments of the present disclosure. FIG. 10C illustrate a top-down view of the structure 1000.

The cross-sections in FIGS. 10A and 10B are along BB' and AA' lines. The x-direction and y-direction are along the WL direction and BL direction as shown in FIGS. 1-8. The structure 1000 includes a bottom dielectric layer pair 1029 disposed on the substrate 1010. The bottom dielectric layer pair 1029 includes a dielectric layer 1021 (also referred to a first dielectric layer) and a sacrificial layer 1023 (also referred to as a second dielectric layer) that is different from the dielectric layer 1021.

The dielectric layer 1021 can be similar to the dielectric layer discussed above with reference to FIG. 6. In some embodiments, the dielectric layer 1021 includes any suitable insulating materials, for example, silicon oxide, silicon oxynitride, silicon nitride, TEOS or silicon oxide with F-, C-, N-, and/or H-incorporation. The dielectric layer 1021 can also include high-k dielectric materials, for example, hafnium oxide, zirconium oxide, aluminum oxide, tantalum oxide, or lanthanum oxide films. In some embodiments, the dielectric layer 1021 can be any combination of the above materials.

The formation of the dielectric layer 1021 on the substrate 1010 can include any suitable deposition methods such as, chemical vapor deposition (CVD), physical vapor deposition (PVD), plasma-enhanced CND (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the sacrificial layer 1023 includes any suitable material that is different from the dielectric layer 1021 and can be removed selectively with respect to the dielectric layer 1021. For example, the sacrificial layer 1023 can include silicon oxide, silicon oxynitride, silicon nitride, TEOS, poly-crystalline silicon, poly-crystalline germanium, poly-crystalline germanium-silicon, and any combinations thereof. In some embodiments, the sacrificial layer 1023 also includes amorphous semiconductor materials, such as amorphous silicon or amorphous germanium. The sacrificial layer 1023 can be disposed using a similar technique as the dielectric layer 1021, such as CND, PVD, ALD, thermal oxidation or nitridation, or any combination thereof.

In some embodiments, the dielectric layer 1021 can be silicon oxide and the sacrificial layer 1023 can be silicon nitride. The thickness of the dielectric layer 1021 and the sacrificial layer 1023 can range between 10 nm to 500 nm.

In some embodiments, one or more BSG cut structures 1033 can be formed in the dielectric layer pair 1029, extending vertically into the substrate 1010. The BSG cut structures 1033 can have a width $t_1$ ranging from 50 nm to 500 nm. Forming the BSG cut structures 1033 includes, but not limited to, forming one or more trenches in the dielectric layer pair 1029 extending into the substrate 1010, and filling the one or more trenches with insulating materials such as silicon oxide, silicon nitride, silicon oxynitride, SiOCN, or any combination thereof. In some embodiments, forming the BSG cut structures 1033 further includes forming a co-planar surface using chemical mechanical polishing (CMP).

In some embodiments, peripheral devices (not shown) can be formed in the periphery region 205 (in FIG. 2) on the front surface of the substrate 1010. In some embodiments, active device areas (not shown) can also be formed in the memory blocks 203 (in FIG. 2) on the front surface of the substrate 1010. In some embodiments, the substrate 1010 can further include an insulating film on the front surface (not shown in FIGS. 10A and 10B). The insulating film can be made of the same or different material from the dielectric layer pair 1029.

The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks are surrounded by isolation structures, such as shallow trench isolation. Doped regions, such as p-type doped and/or n-type doped wells, can be formed in the active device area according to the functionality of the array devices in the memory blocks.

As shown in FIG. 10C, in some embodiments, the structure 1000 of the 3D memory device can include one or more channel structure regions 1042, one or more center staircase regions 1046, at least one staircase bridge region 1044, and at least one BSG contact region 1048. In some embodiments, the channel structure regions 1042 can be arranged on opposite sides of the center staircase regions 1046 along x-direction The staircase bridge region 1044 can be arranged on one side of the center staircase regions 1046 in y-direction. The BSG contact region 1048 can be sandwiched between center staircase regions 1046 along x-direction. The channel structure region 1042 can be used to form the memory strings in the subsequent processes. The center staircase regions 1046 can be used to form staircase structures in the subsequent processes. The staircase bridge region 1044 can be used to form a staircase bridge structure in the subsequent processes. The BSG contact region 1048 can be used to form BSG contacts in the subsequent processes.

The BSG cut structures 1033 can separate the sacrificial layer 1023 in the bottom dielectric layer pair 1029 into multiple sacrificial layer segments which correspond to multiple BSG segments (e.g., BSG segments 582, 584, 586 as shown in FIG. 5) to be formed in the subsequent processes. In some embodiments as shown in FIG. 10, the BSG cut structures 1033 can extend along x-direction in the channel structure regions 1042 and the center staircase regions 1046, and can include one or more non-linear sections in the at least one bottom select gate (BSG) contact region 1048. It is noted that, the one or more non-linear sections of the BSG cut structures 1033 can include one or more straight portions that extend along different directions (e.g., x-direction and y-direction) as shown in FIG. 10C, or one or more curved portions (not shown), or any other suitable non-linear portions.

It is noted that, each memory block (e.g., memory block 203 in FIG. 2) can include any suitable number of the BSG cut structures 1033. The design of the BSG cut structures 1033 can include any suitable patterns and/or shapes to divide the sacrificial layer 1023 in the bottom dielectric layer pair 1029 into multiple sacrificial layer segments. In one example, FIG. 10C illustrates two BSG cut structures 1033 and the patterns of the two BSG cut structures 1033 are the same with the patterns of the two BSG cut structures 595 as shown in FIGS. 5 and 6. In some other examples, the number and patterns of the BSG cut structures 1033 can also be referred to the BSG cut structures 795 and 895 as shown in FIGS. 7 and 8, respectively. The numbers and patterns of the BSG cut structures shown in the figures are used for illustrative purpose only, but not limit the scope of the present disclosure.

Figure 11A:
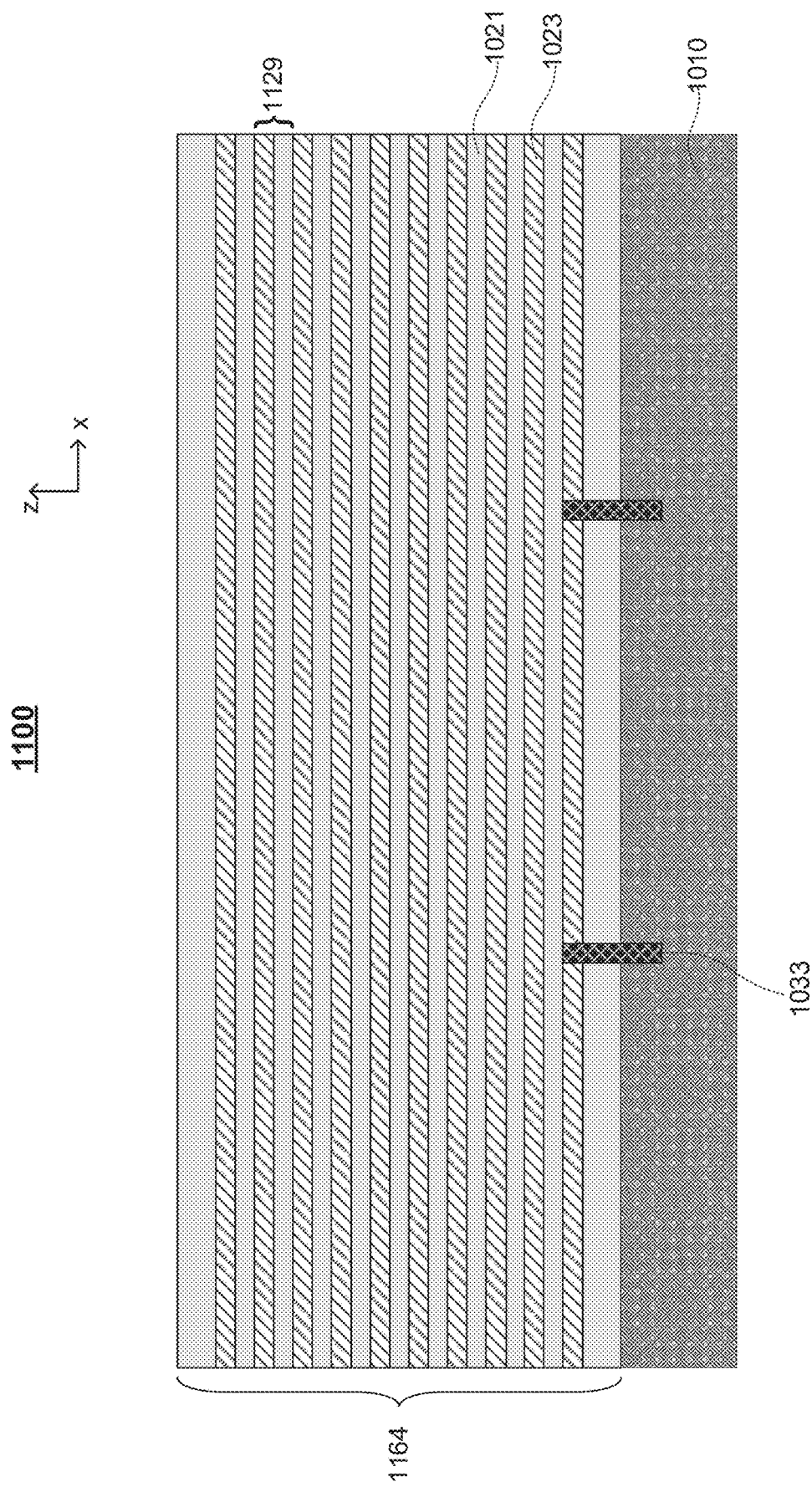
FIGS. 11A and 11B illustrate cross-sectional views a 3D memory structure at certain process step, according to some embodiments of the present disclosure.
Figure 11B:
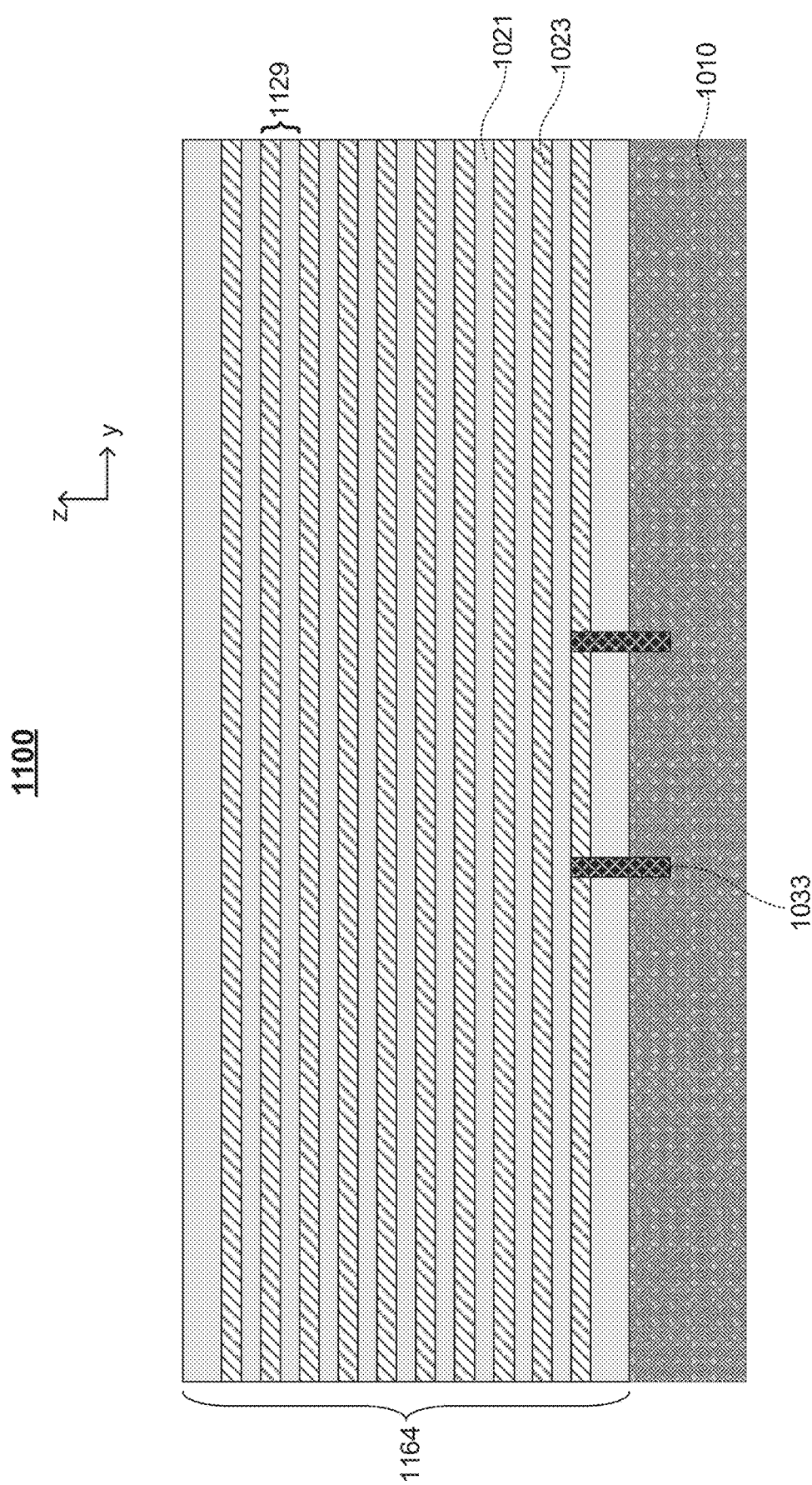

Referring back to FIG. 9, the method can proceed to step S920, in which a plurality of dielectric layer pairs 1129 can be disposed on the substrate 1010 to form an alternating dielectric stack 1164. FIGS. 11A and 11B illustrate cross-sectional views of an exemplary structure 1100 along x- and y-directions, respectively, according to some embodiments of the present disclosure. The alternating dielectric stack 1164 extends in a lateral direction that is parallel to the front surface of the substrate 1010. The dielectric layers 1021 and the sacrificial layers 1023 can be alternatingly stacked on top of each other in the alternating dielectric stack 1164. In the other words, each sacrificial layer 1023 can be sandwiched between two dielectric layers 1021, and each dielectric layer 1021 can be sandwiched between two sacrificial layers 1023 (except the bottommost and the topmost layer).

The formation of the alternating dielectric stack 1164 can include disposing the dielectric layers 1021 to each have the same thickness or to have different thicknesses. Example thicknesses of the dielectric layers 1021 can range from 10 nm to 500 nm, preferably about 25 nm. Similarly, the sacrificial layer 1023 can each have the same thickness or have different thicknesses. Example thicknesses of the sacrificial layer 1023 can range from 10 nm to 500 nm, preferably about 35 nm. It should be understood that the number of dielectric layer pairs 1129 in FIG. 11 is for illustrative purposes only and that any suitable number of layers can be included in the alternating dielectric stack 1164.

In some embodiments, the alternating dielectric stack 1164 can include layers in addition to the dielectric layer 1021 and the sacrificial layer 1023, and can be made of different materials and/or with different thicknesses.

Figure 12A:
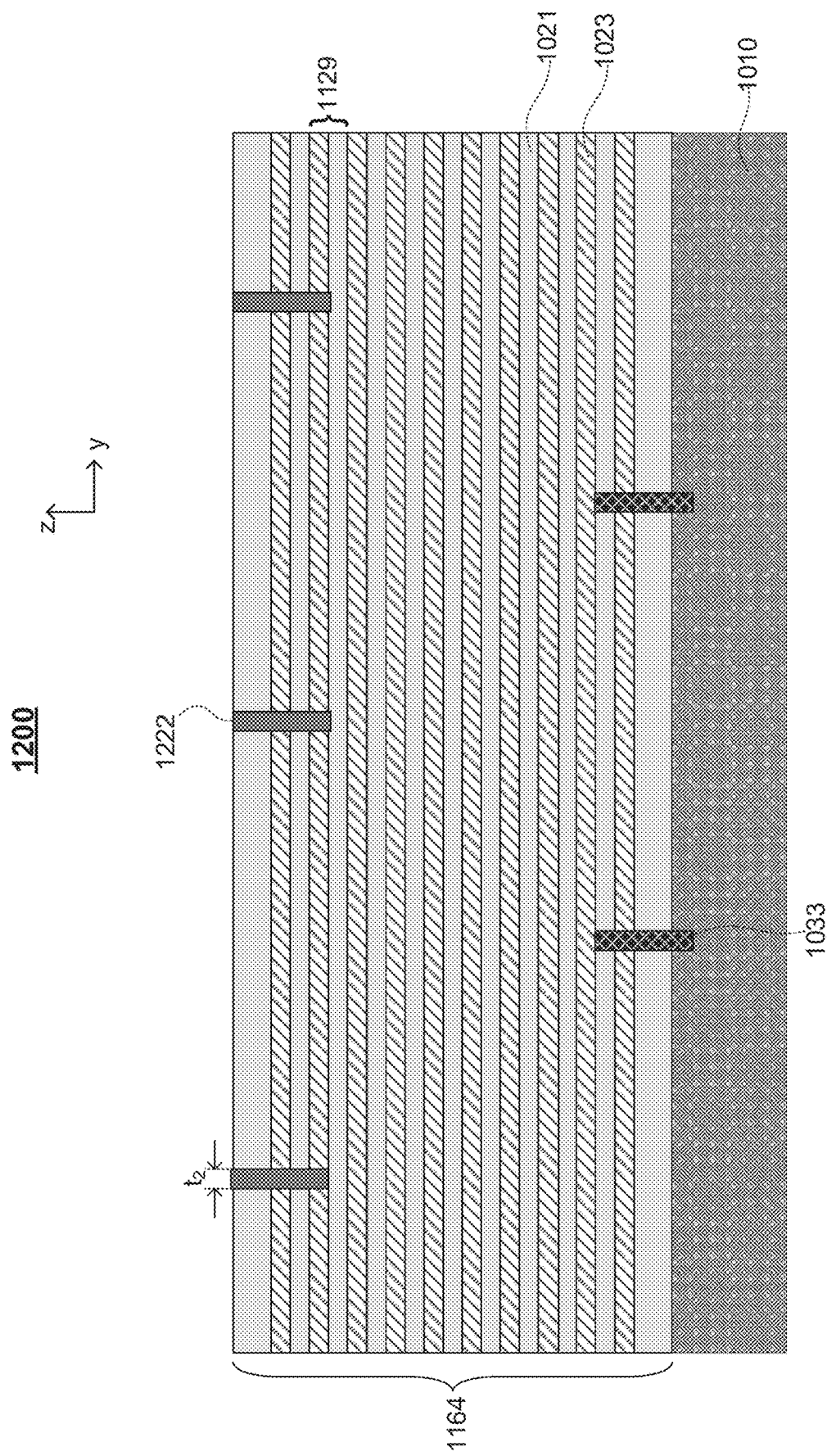
FIG. 12A illustrates a cross-sectional view a 3D memory structure at certain process step, according to some embodiments of the present disclosure.
Figure 12B:
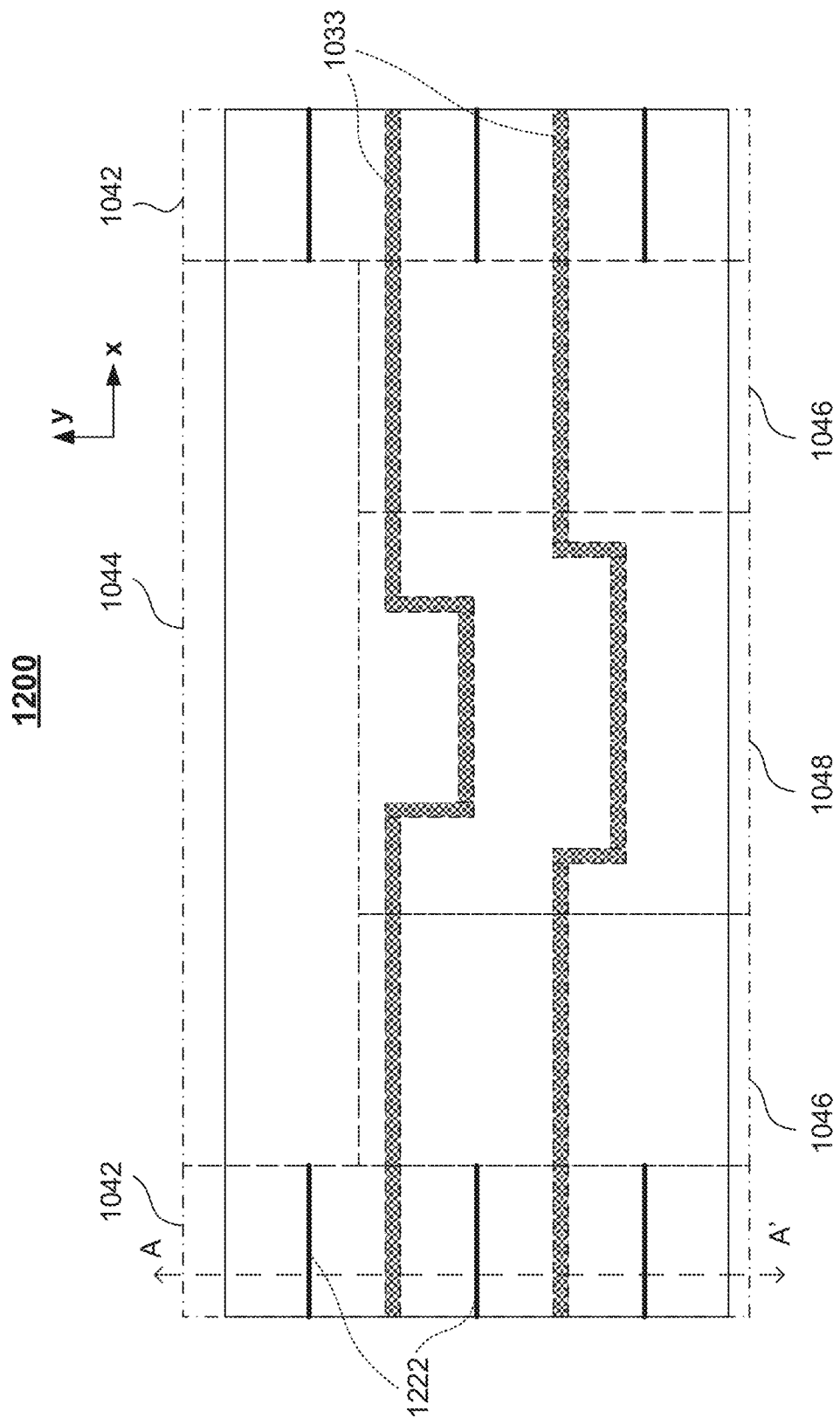
FIG. 12B illustrates a top-down view of the 3D memory structure in FIG. 12A, according to some embodiments of the present disclosure.

Referring back to FIG. 9, the method 900 can proceed to step S930, in which one or more top select gate (TSG) cut structures 1222 can be formed in an upper portion of the alternating dielectric stack 1164. FIG. 12A illustrates a cross-sectional view of an exemplary structure 1200 along y-direction, according to some embodiments of the present disclosure. FIG. 12B illustrates a top down view of the structure 1200, where the cross-section in FIG. 12A is along the line AA' in FIG. 12B. In some embodiments, one or more TSG cut structures 1222 can extend vertically through one or more dielectric layer pairs 1129, The TSG cut structures 1222 can extend laterally in x-direction with a width $t_2$ ranging from 50 nm to 500 nm, Forming the TSG cut structures 1222 includes, but not limited to, forming one or more trenches in the one or more dielectric layer pairs 1129 in the upper portion of the alternating dielectric stack 1164, and filling the one or more trenches with insulating materials such as silicon oxide, silicon nitride, silicon oxynitride, SiOCN, or any combination thereof. In some embodiments, forming the TSG cut structures 1222 further includes forming a co-planar surface using chemical mechanical polishing (CMP).

Figure 13A:
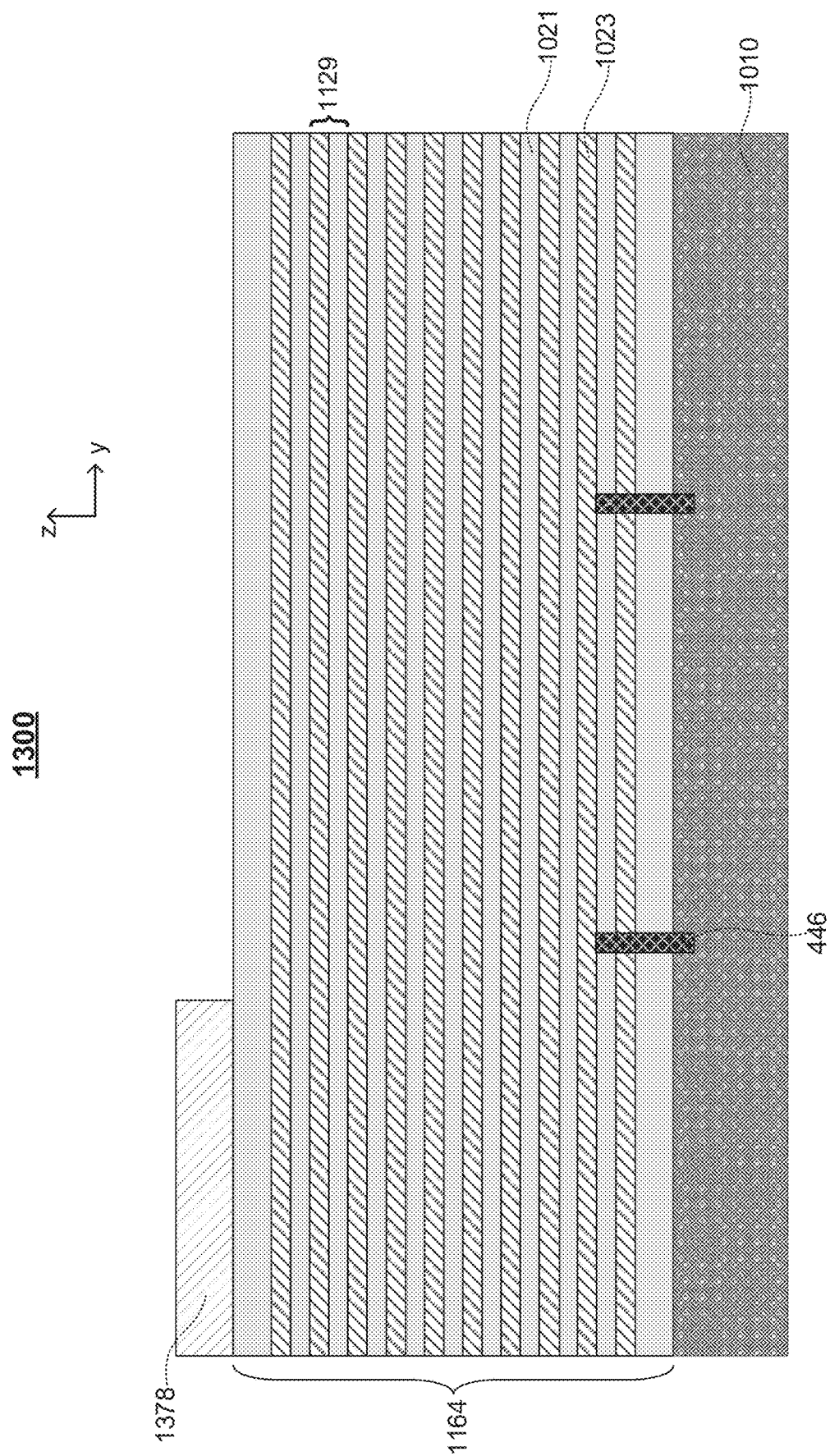
FIG. 13A illustrates a cross-sectional view a 3D memory structure at certain process step, according to some embodiments of the present disclosure.
Figure 13B:
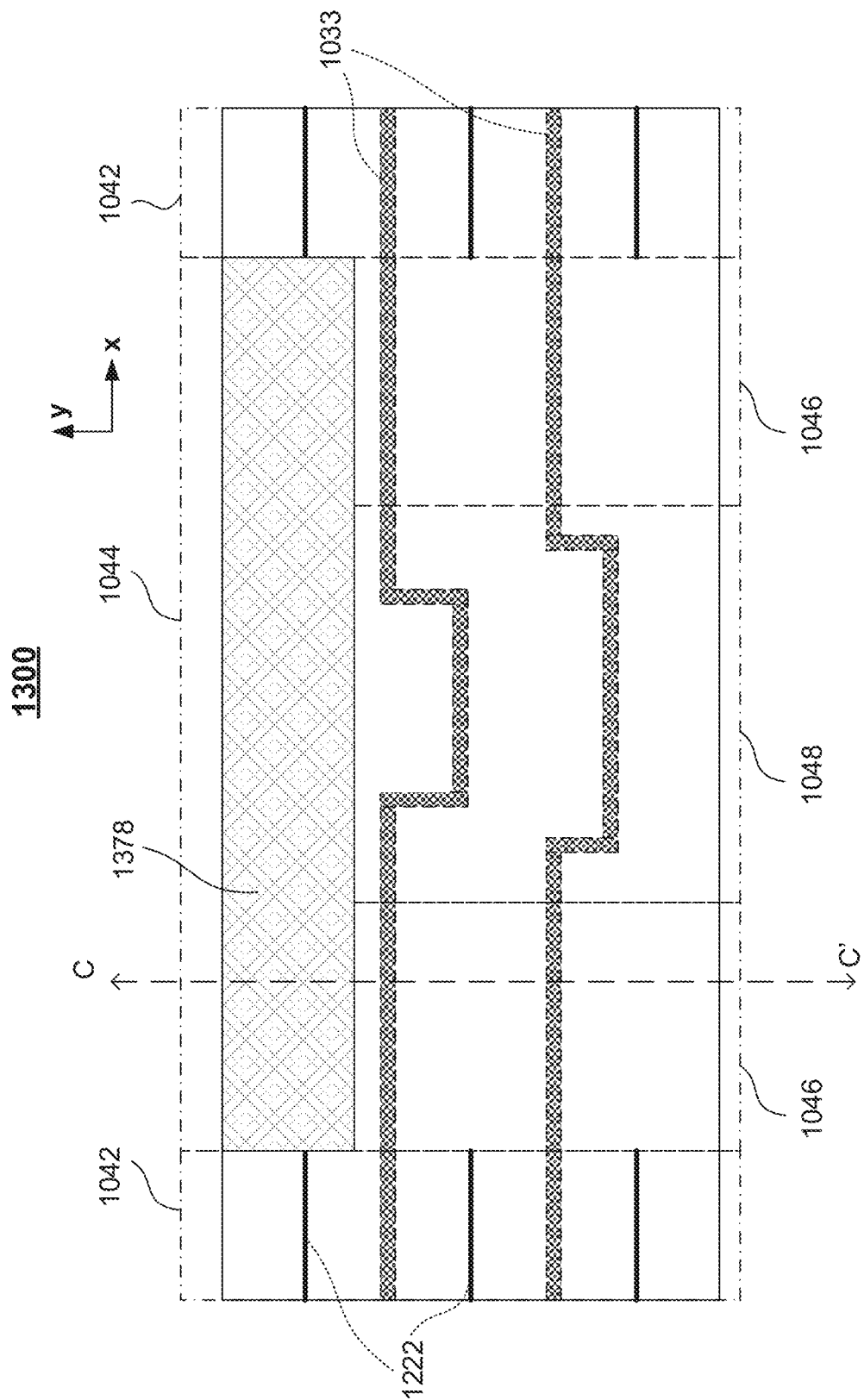
FIG. 13B illustrates a top-down view of the 3D memory structure in FIG. 13A, according to some embodiments of the present disclosure.

Referring back to FIG. 9, the method 900 can proceed to step S940, in which a hard mask 1378 can be disposed on the alternating dielectric stack 1164 in the staircase bridge region 1044. FIG. 13A illustrates a cross-sectional view of an exemplary structure 1300 at process step S940, where a top-down view of the structure 1300 is illustrated in FIG. 13B. The cross-sectional view in FIG. 13A is in y-direction along line CC'.

In some embodiments, the hard mask 1378 can include dielectric materials such as silicon oxide, silicon oxynitride, silicon nitride, TEOS, silicon-containing anti-reflective coating (SiARC), amorphous silicon, polycrystalline silicon, high-k dielectric materials, or any combination thereof. The hard mask 1378 can be used to form the staircase bridge in the subsequent steps. The hard mask 1378 can define a width and a length of the staircase bridge. The hard mask 1378 can include a thickness large enough to protect the underlying alternating dielectric stack 1164 during the subsequent etching processes. The hard mask 1378 can be disposed on the alternating dielectric stack 1164 by using CVD, ALD, PVD, thermal oxidation or nitridation, evaporating, sputter, spin-coating, or any suitable thin film deposition process. The hard mask can then be patterned using a photolithography process and an etching process such as reactive-ion-etching (RIE).

Figure 14A:
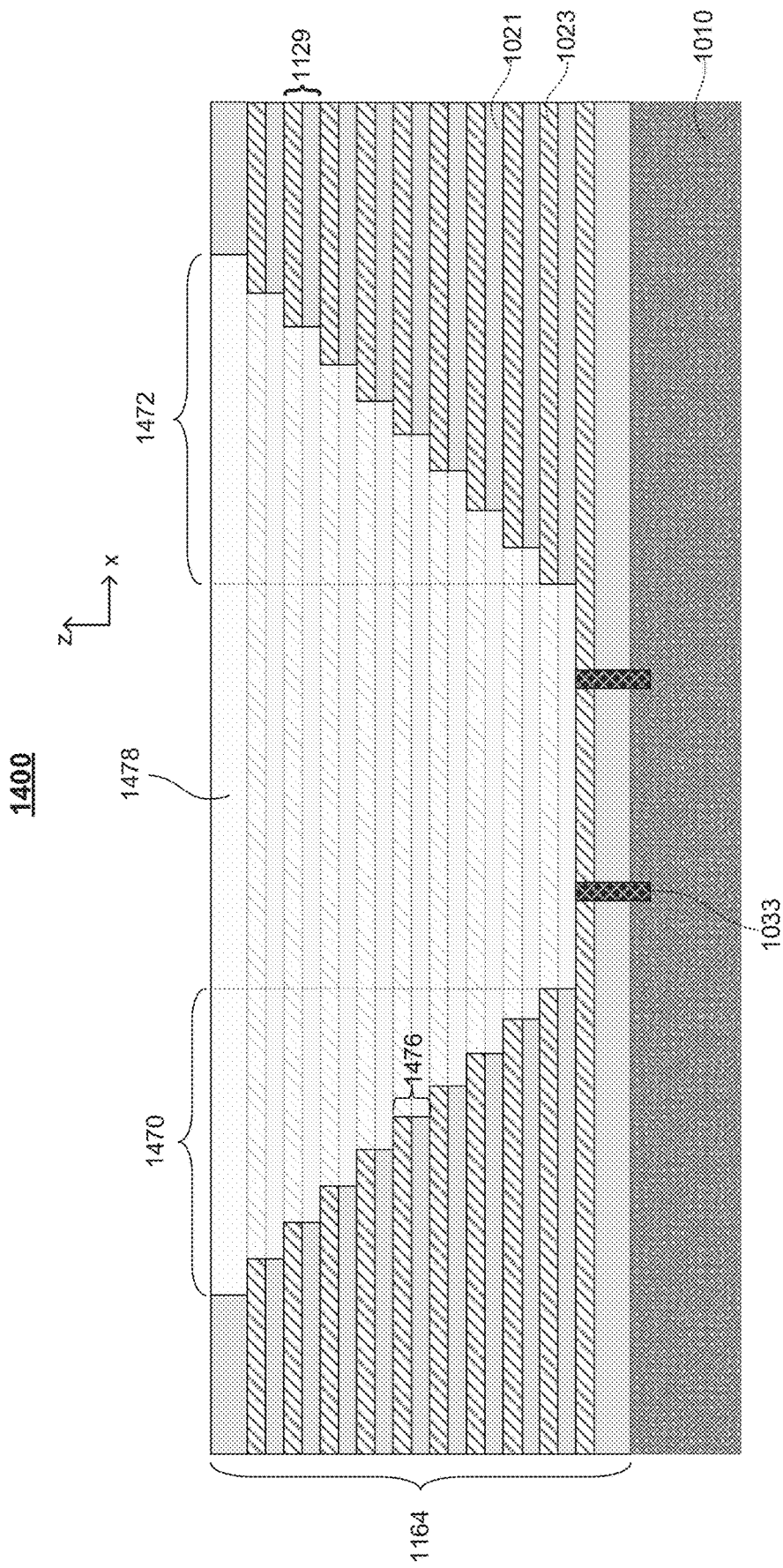
Figure 14C:
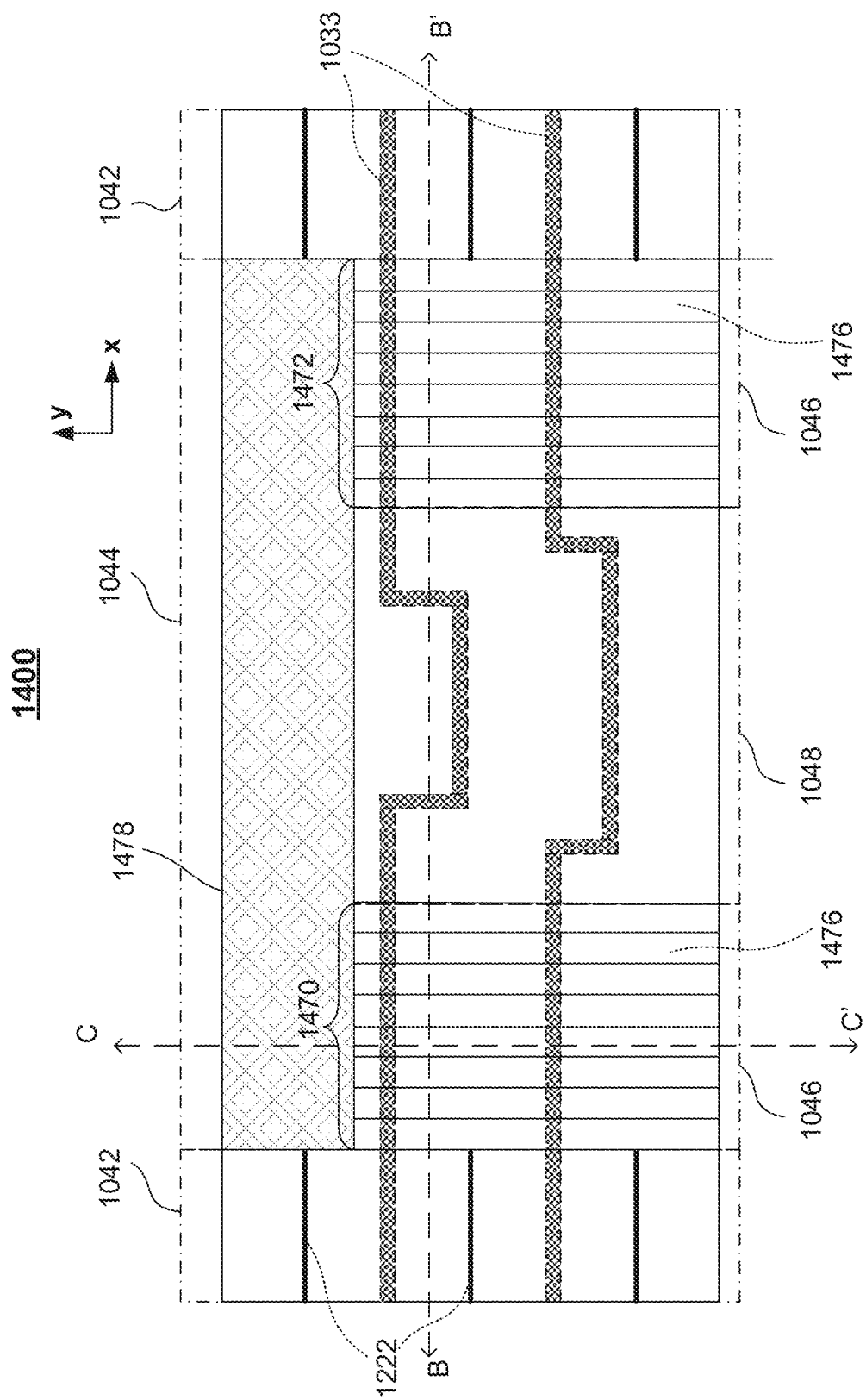
FIG. 14C, illustrates a top-down view of the 3D memory structure in FIGS. 14A and 14B, according to some embodiments of the present disclosure.

Referring back to FIG. 9, the method 900 can proceed to step S950, in which a first dielectric staircase structure 1470 and a second dielectric staircase structure 1472 can be formed in the two center staircase regions 1046, respectively, where the first and second dielectric staircase structures can be connected by a dielectric bridge 1478. FIGS. 14A and 14B illustrate cross-sectional views of an exemplary structure 1400 along x- and y-directions, respectively, according to some embodiments of the present disclosure. FIG. 14C illustrates a top down view of the structure 1400, where the cross-sections in FIGS. 14A and 14B are along line RB' and line CC'. In some embodiments, the staircase region 210 can be disposed in the middle of the alternating dielectric stack 1164.

In the first and second dielectric staircase structures 1470 and 1472, a staircase 1476 (also referred as "staircase step" or "staircase layer"), refers to a layer stack with the same lateral dimension in a surface parallel to the front surface of the substrate 1010. Each staircase 1476 terminates at a shorter length than the staircase underneath. In some embodiments, each staircase 1476 includes one dielectric layer pair 1129. In some embodiments, each staircase 1476 can include two or more dielectric layer pairs 1129.

The first and second dielectric staircases 1470 and 1472 can be formed by applying a repetitive etch-trim process on the alternating dielectric stack 1164 using a patterning mask (not shown). In some embodiments, the patterning mask can include a photoresist or carbon-based polymer material. In some embodiments, the patterning mask can also include a hard mask, such as silicon oxide, silicon nitride, TEOS, silicon-containing anti-reflective coating (SiARC), amorphous silicon, polycrystalline silicon, or any combination thereof.

The etch-trim process includes an etching process and a trimming process. During the etching process, a portion of each staircase 1476 with exposed surface can be removed. The remaining portion of each staircase 1476, either covered by upper levels of staircase steps or covered by the patterning mask, is not etched. The etch depth is a thickness of the staircase 1476. In some embodiments, the thickness of the staircase 1476 is a thickness of one dielectric layer pair 1129. The etching process for the dielectric layer 1021 can have a high selectivity over the sacrificial layer 1023, and/or vice versa. Accordingly, an underlying dielectric layer pair 1129 can function as an etch-stop layer. By switching etching process for each layer, the staircase 1476 can be etched during one etching cycle. And as a result, one staircase 1476 is formed during each etch-trim cycle.

In some embodiments, the staircase 1476 can be etched using an anisotropic etching such as a reactive ion etch (RIE) or other dry etch processes. In some embodiments, the dielectric layer 1021 is silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed etching approach can be used. In some embodiments, the sacrificial layer 1023 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer stack should not be limited by the embodiments of the present disclosure.

The trimming process includes applying a suitable etching process (e.g., an isotropic dry etch or a wet etch) on the patterning mask such that the patterning mask can be pulled back laterally The lateral pull-back dimension determines the lateral dimension of each staircase of the first and second dielectric staircase structures 1470 and 1472. After patterning mask trimming, one portion of the topmost staircase 1476 is exposed and the other portion of the topmost staircase 1476 remains covered by the patterning mask. The next cycle of etch-trim process resumes with the etching process.

In some embodiments, the patterning mask trimming process can include dry etching, such as RIE, using $O_2$, Ar, $N_2$, etc.

In some embodiments, the topmost staircase 1476 can be covered by the dielectric layer 1021. In some embodiments, the topmost staircase 1476 can further be covered by other dielectric materials. A process step of removing the dielectric layer 1021 and/or the other dielectric materials can be added to the etching process of each etch-trim cycle to form the first and second dielectric staircase structures 1470 and 1472.

In some embodiments, the dielectric bridge 1478 can be formed simultaneously as the first and second dielectric staircase structures 1470 and 1472, where the dielectric bridge 1478 can be defined by the hard mask 1378. During the etch-trim process, a portion of the alternating dielectric stack 1164 below the hard mask 1378 can be protected and is not etched As a result, the dielectric layer 1021 and the sacrificial layer 1023 in the first and second dielectric staircase structures 1470 and 1472 can be connected through the dielectric bridge 1478 for each staircase 1476.

In some embodiments, after the etch-trim process, the sacrificial layer 1023 in the bottom dielectric layer pair 1029 can be exposed in the BSG contact region 1048. In some embodiments, the hard mask 1378 and the patterning mask for the etch-trim process can be removed after the process step S950.

Figure 15A:
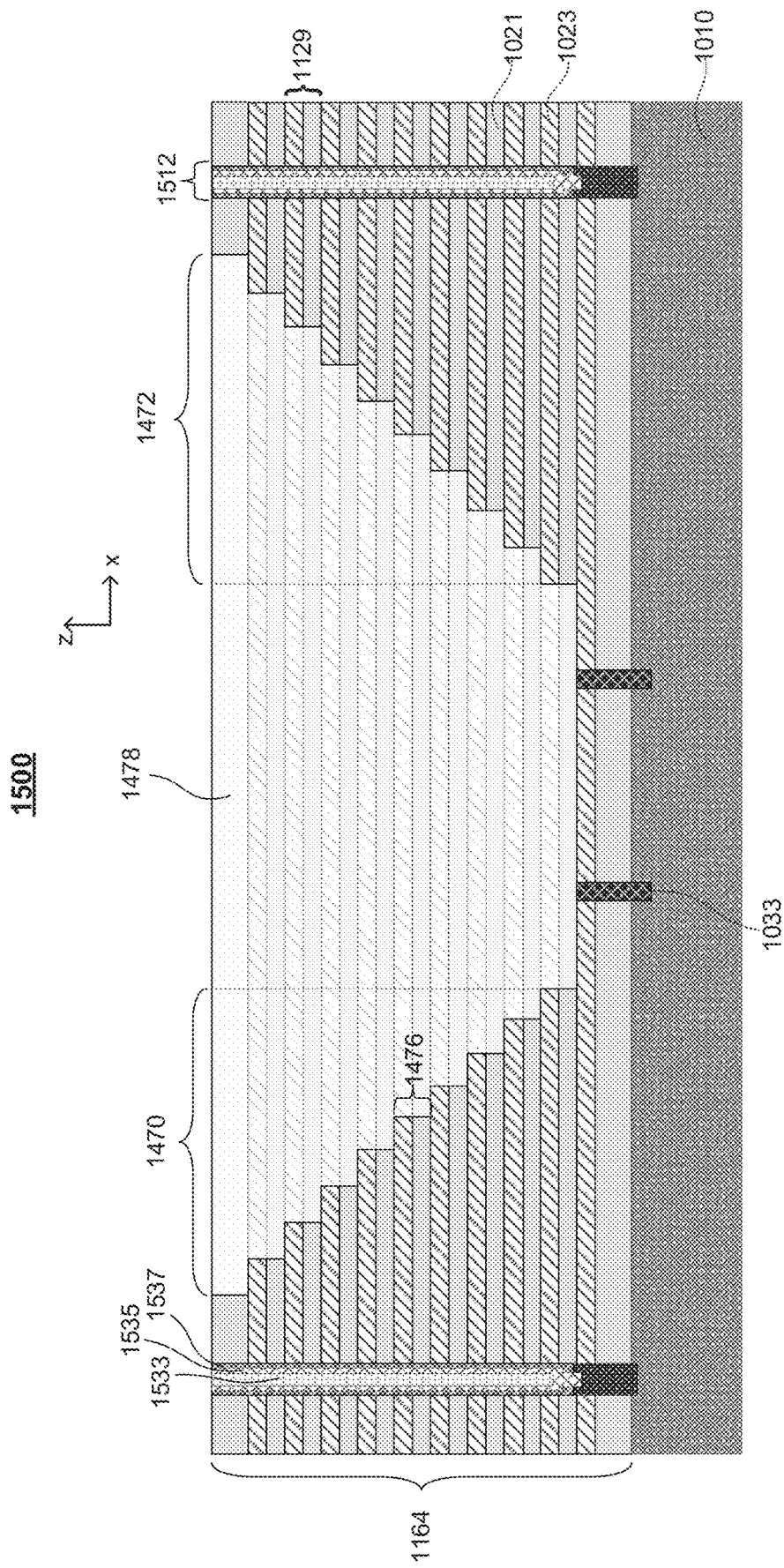
FIG. 15A illustrates a cross-sectional view a 3D memory structure at certain process step, according to some embodiments of the present disclosure.
Figure 15B:
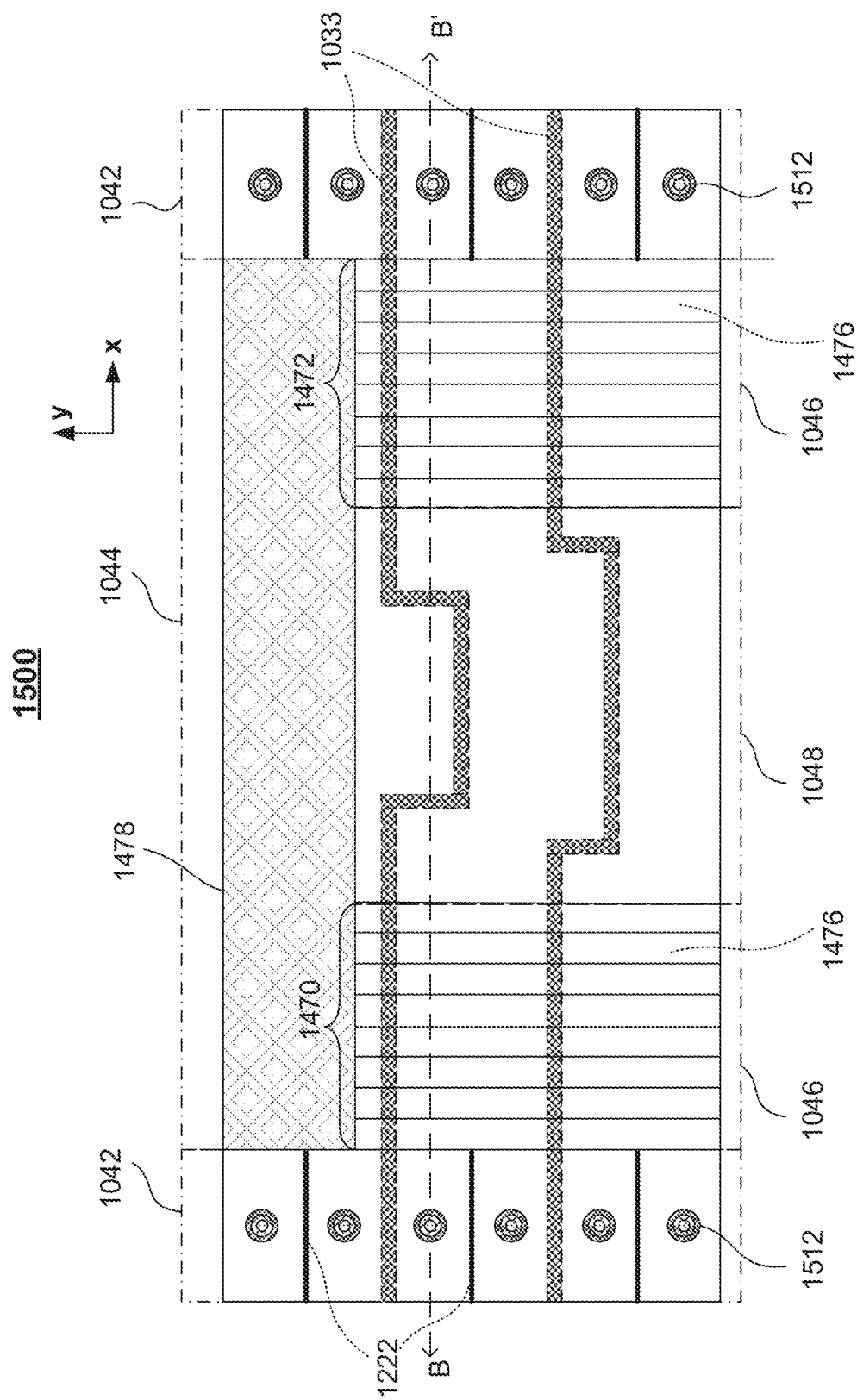
FIG. 15B illustrates a top-down view of the 3D memory structure in FIG. 15A, according to some embodiments of the present disclosure.

Referring back to FIG. 9, the method 900 can proceed to step S960, in which a plurality of memory strings 1512 (also referred as "channel structures") can be formed in the alternating dielectric stack 1164 in the channel structure regions 1042, according to some embodiments of the present disclosure. FIG. 15A illustrates a cross-sectional view of an exemplary structure 1500 at process step S960. FIG. 15B illustrates a top-down view of the structure 1500. The cross-sectional view in FIG. 15A is in x-direction along line BB' as shown in FIG. 15B. The memory strings 1512 are similar to the memory strings 136, 632 discussed above with reference to FIGS. 1 and 6.

In some embodiments, priority to forming the plurality of memory strings 1512, an insulating layer 1582 can be disposed over the first and second dielectric staircases 1470 and 1472. The insulating layer 1582 can include any suitable insulator, for example, spin-on-glass, silicon oxide, low-k dielectric material such as carbon-doped oxide (CDO or SiOC or SiOC:H), or fluorine doped oxide (SiOF), etc. The insulating layer 1582 can be disposed by CVD, PVD, sputtering, spin-coating, etc. In some embodiments, a planarization process, for example RIF etch-back or chemical mechanical polishing (CMP), can be performed to form a coplanar surface, parallel to the surface 330ƒ of the substrate 1010.

To form the plurality of memory strings 1512, a plurality of channel holes can be formed first in the alternating dielectric stack 1164, penetrating the entire alternating dielectric stack 1164 and extending into the substrate 1010.

After forming the channel holes, the memory film 1537 can be disposed on a sidewall of each channel hole 336. In some embodiments, the memory film 1537 can be a composite layer including a tunneling layer, a storage layer (also known as "charge trap/storage layer"), and a tunneling blocking layer. Next, a channel layer 1535 and a core filling film 1533 can be disposed inside the channel holes. The channel layer 1535 covers a sidewall of the memory film 1537 inside the channel hole 336, The channel layer 1535 can be any suitable semiconductor material such as silicon. The core filling film 1533 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof.

In some embodiments, dummy memory strings (e.g., the dummy memory strings 312, 422 in FIGS. 3 and 4) can also be formed in the alternating dielectric stack 1164, adjacent to the memory strings 1512 in the channel structure regions 1042 and/or in the center staircase regions 1046. While the memory strings 1512 can be used for memory storage, dummy, memory strings can be used to provide structural support and improve process uniformity during manufacturing. In some embodiments, the dummy memory strings can also include the core filling film 1533 and can be formed using similar techniques as the memory strings 1512.

Figure 16:
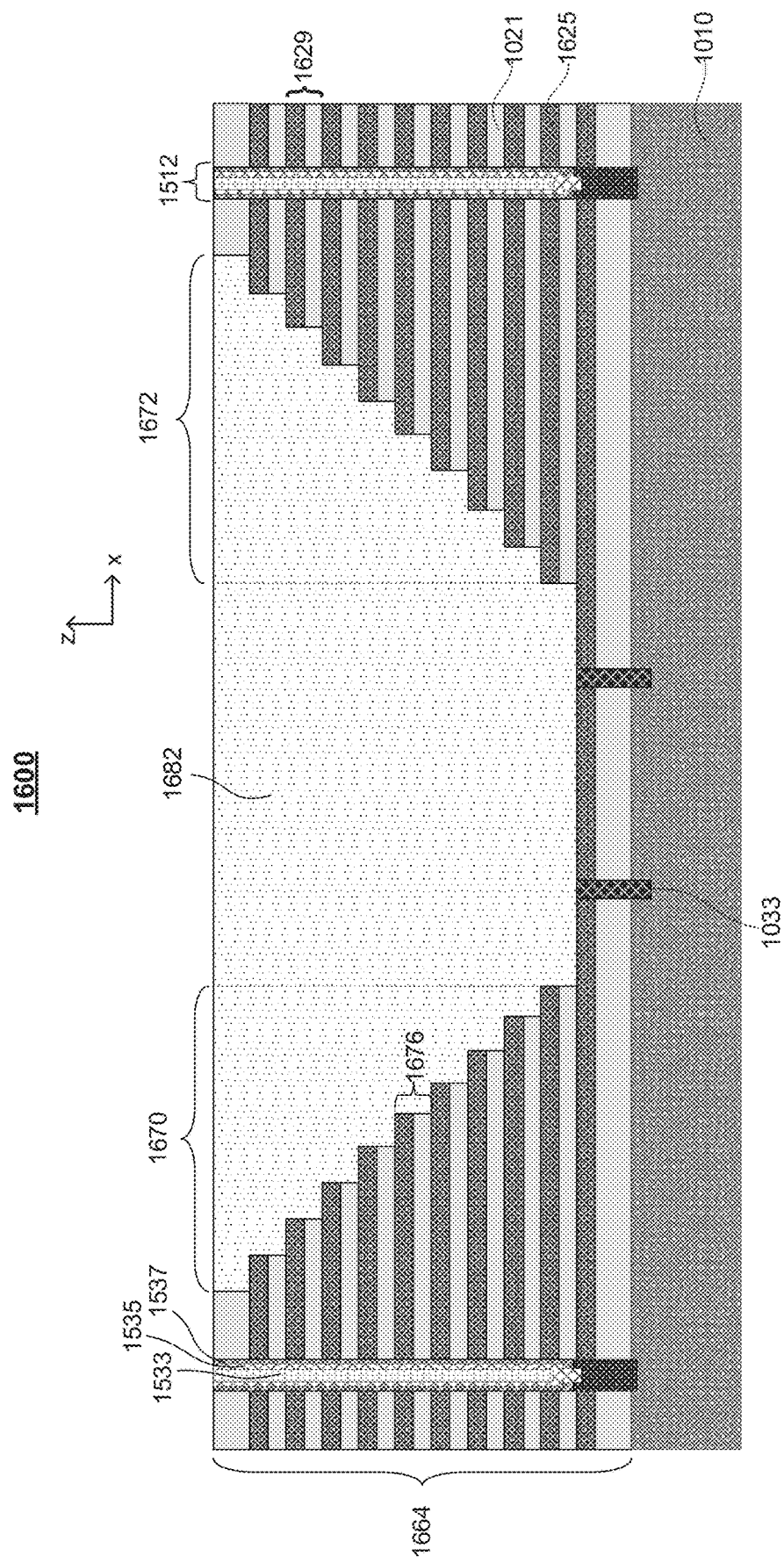
FIG. 16 illustrates a cross-sectional view a 3D memory structure at certain process step, according to some embodiments of the present disclosure.

Referring back to FIG. 9, the method 900 can proceed to step S970, in which an alternating conductor/dielectric stack 1664 of alternating conductive and dielectric layers can be formed by replacing the sacrificial layers 1023 in the alternating dielectric stack 1164 in FIG. 15A with conductive layers 1625. FIG. 16 illustrates a cross-sectional view of an exemplary structure 1600, according to some embodiments of the present disclosure. The alternating conductor/dielectric stack 1664 is similar to the alternating conductor/dielectric stack 620 previously discussed with reference to FIG. and 6. After replacing the sacrificial layers 1023 with conductive layers 1625, staircase structures 1670 and 1672 can be formed in the center staircase regions 1046.

The alternating conductor/dielectric stack 1664 of alternating conductive and dielectric layers includes conductive layers 1625 sandwiched between the dielectric layers 1021. In structure 1600, each staircase 1676 includes a conductive and dielectric layer pair 1629. In some other embodiments, each staircase step 1686 can include two or more conductive and dielectric layer pairs 1629, each conductive and dielectric layer pair having one conductive layer 1625 and one dielectric layer 1021.

To form the staircase structures 1670 and 1672, the sacrificial layers 1023 in the alternating dielectric stack 1164 in FIG. 15A can be removed selectively over the dielectric layers 1021 to form a plurality of horizontal tunnels. The selective etching of the sacrificial layers 1023 can include wet or dry chemical etching. Then, the conductive layers 1625 can be disposed in the horizontal tunnels.

The conductive layers 1625 can include any suitable conductive material that is suitable for a gate electrode, e.g., tungsten (W), aluminum (Al), copper (Cu), cobalt (Co), titanium (Ti), tantalum (Ta), titanium nitride (TiN), tantalum nitride (TaN), and/or any, combination thereof. The conductive material can be disposed by CVD, PVD, ALD, sputtering, evaporation, etc. In some embodiments, the conductive layers 1625 can also be poly-crystalline semiconductors, such as poly-crystalline silicon, poly-crystalline germanium, poly-crystalline germanium-silicon, and/or combinations thereof. In some embodiments, the poly-crystalline material can be incorporated with any suitable types of dopant, such as boron, phosphorous, or arsenic. In some embodiments, the conductive layers 1625 can also be amorphous semiconductors.

In some embodiments, a gate dielectric layer (not shown) can be disposed in the horizontal tunnels prior to the conductive layers 1625 to reduce leakage current between adjacent word lines (gate electrodes) and/or to reduce leakage current between gate and channel. The gate dielectric layer can include silicon oxide, silicon nitride, silicon oxynitride, and/or any suitable combinations thereof. The gate dielectric layer can also include high-k dielectric materials, such as hafnium oxide, zirconium oxide, aluminum oxide, tantalum oxide, lanthanum oxide, and/or any combination thereof. The gate dielectric layer can be disposed by one or more suitable deposition processes, such as CVD, PVD, and/or ALD.

The conductive layers 1625 function as gate electrodes at the intersection with memory strings 1512. It is noted that, the conductive layer 1625 in the bottom conductive and dielectric layer pair exposed in the BSG contact region 1048 can include a plurality of segments that are separated by BSG cut structures 1033 as shown in FIG. 15B. The plurality, of segments of the conductive layer 1625 in the bottom conductive and dielectric layer pair exposed in the BSG contact region 1048 are used as BSG segments 582, 584, 586 as described above in connection with FIGS. 5 and 6.

In some embodiments, an insulating structure 1682 can be form in the center staircase regions 1046 and the BSG contact region 1048 to cover the staircase structures 1670, 1672 and the plurality of BSG segments (e.g., the conductive layer 1625 in the bottom conductive and dielectric layer pair). The insulating structure can include with any suitable dielectric materials such as silicon oxide, silicon nitride, silicon oxynitride, SiOCN, or any combination thereof.

It is noted that the number of memory strings and gate electrodes in FIG. 16 are shown for illustrative purposes, and can be any suitable number to increase storage capacity.

Referring back to FIG. 9, the method 900 can proceed to step S980, in which a plurality of contact structures can be formed to contact the corresponding conductive layer respectively. In some embodiments, the plurality of contact structures can include multiple staircase contacts (e.g., word line contacts, TSG contacts) in the center staircase regions 1046, and multiple BSG contacts in the BSG contact region 1048. The plurality of contact structures can penetrate the insulating structure to contact the corresponding conductive layer respectively.

Figure 17A:
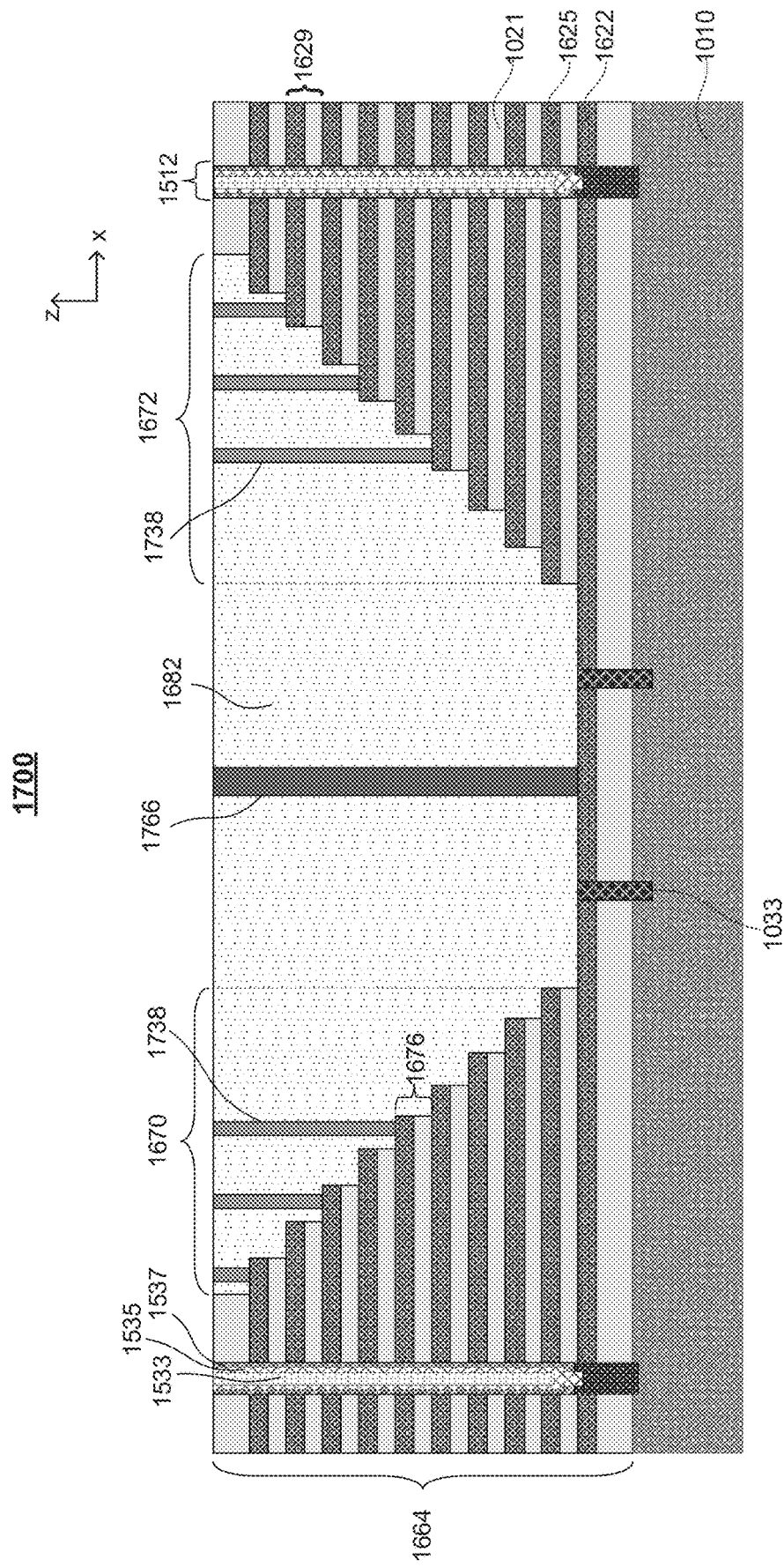
FIG. 17A illustrates a cross-sectional view a 3D memory structure at certain process step, according to some embodiments of the present disclosure.
Figure 17B:
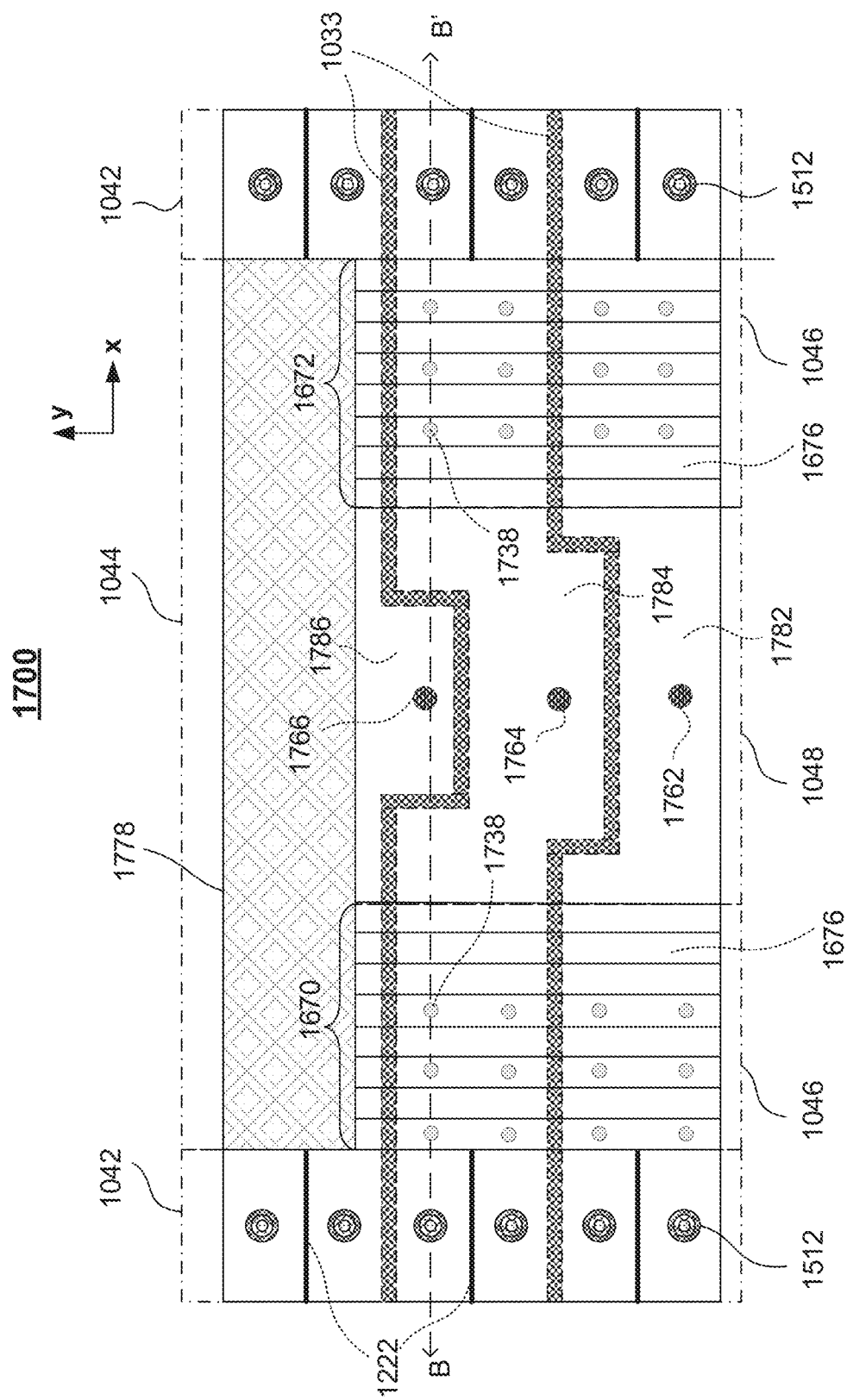
FIG. 17B illustrates a top-down view of the 3D memory structure in FIG. 17A, according to some embodiments of the present disclosure.

FIG. 17A illustrates a cross-sectional view of an exemplary structure 1700 at process step S980. FIG. 17B illustrates a top-down view of the structure 1700. The cross-sectional view in FIG. 17A is in x-direction along line BB'. The staircase contacts 1738 can be similar to the staircase contacts 538 discussed previously with reference to FIGS. 5-6. The BSG contacts 1762, 1764, 1766 can be similar to the BSG contacts 562, 564, 566 discussed previously with reference to FIGS. 5-6.

Forming the contact structures can include forming a plurality of contact holes through the insulating layer 1682 and disposing conductive material in the plurality of contact holes. In some embodiments, photoresist or polymer material can be used as a mask layer to etch the contact holes. One or more masks and patterning processes can be used to form the contact holes. In some embodiments, the insulating layer 1682 can include an etch-stop layer (not shown) that protects the underlying structure until all the contact holes are formed on each staircase 1676 and/or each BSG segments 1782, 1784, 1786. The contact holes penetrate through the insulating layer 1882, exposing the conductive layers 1625.

The contact structures including the staircase contacts 1738 and the BSG contacts 1762, 1764, 1766 can be formed by disposing a conductive material in the contact holes. In some embodiments, the contact structures can include a metal or metallic compound, such as tungsten, cobalt, nickel, copper, aluminum, titanium, tantalum, tantalum nitride (TaN), and/or any combination thereof. The metal or metallic compound can be formed by any suitable deposition methods, for example, sputtering, thermal evaporation, e-beam evaporation, ALD, PVD, and/or any combination thereof. In some embodiments, the contact structures can also include a metal silicide, including $WSi_x$, $CoSi_x$, $NiSi_x$, or $AlSi_x$, etc. In some embodiments, the contact structures can be coplanar with the insulating layer 1682 using a planarization process, for example, a CMP process.

Through the contact structures, the electrical conductive path for the plurality of conductive layers 1625 can be wired up to the surface; enabling various interconnects for the 3D memory device in the back-end-of-line process.

In some embodiments, the staircase contacts 1738 can include TSG contacts formed on the gate electrodes for the TSGs and WL contacts formed on the gate electrodes of the word lines, respectively. In some embodiments, one or more BSG contacts 1762, 1764, 1766 can be can be formed on BSG segments 1782, 1784, 1786 respectively.

It is noted that, after replacing the sacrificial layers 1023 with the conductive layers 1625, the dielectric bridge 1478 in FIGS. 14B and 15B can be converted to a staircase bridge 1778 in FIG. 17B. As a result, the conductive layers 1625 of the staircase structures 1670 and 1672 can be connected through the staircase bridge 1778. Therefore, each word line can be electrically connected either from the staircase structure 1670 or the staircase structure 1672.

As described above (referring to FIGS. 5-8), by introducing BSG cut structures 1033 that include non-linear sections in the BSG contact region 1048, each BSG segments 1782, 1784, 1786 can have a sufficient contact area in the BSG contact regions 280 for configuring one or more BSG contacts 1762, 1764, 1766, respectively. Specifically as shown in FIG. 17B, the BSG segment 1786 that is partially block by staircase bridge 1778 can include an extended area in the y-direction that is not covered by the staircase bridge 1778, thereby providing sufficient contact area for configuring one or more BSG contacts 1766. As such, the width of the staircase bridge 1778 in y-direction can be increased to reduce resistance, thereby providing a better electric connection between words lines on both center staircase regions 1046.

Figure 18:
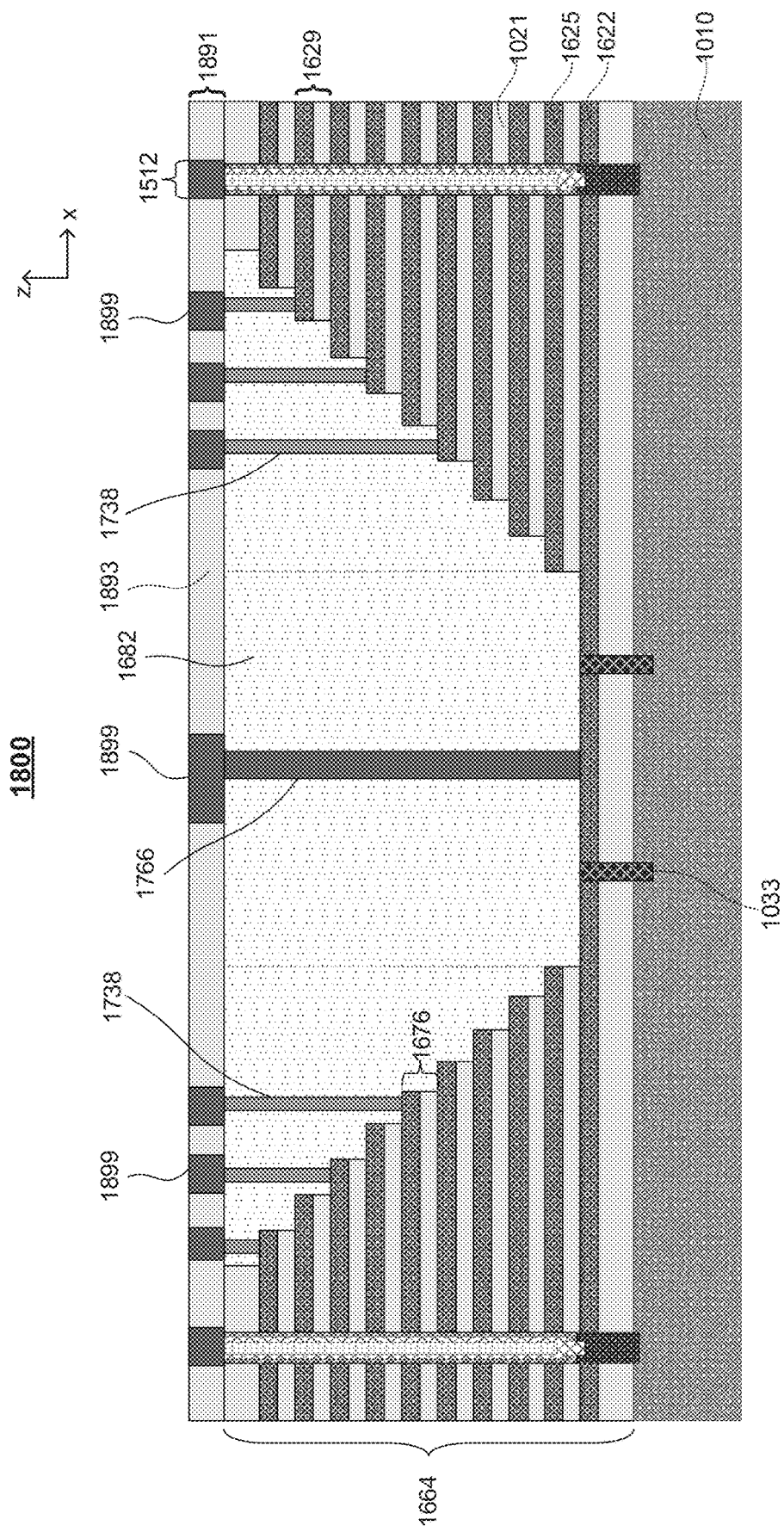
FIG. 18 illustrates a cross-sectional view a 3D memory structure at certain process step, according to some embodiments of the present disclosure.

Referring back to FIG. 9, the method 900 can proceed to step S970, in which a patented conductive layer 1891 can be formed above the alternating conductor/dielectric layer stack 1664 and the insulating structure 1682 to form a plurality of connecting lines 1899. FIG. 18 illustrates a cross-sectional view of an exemplary structure 1800, according to some embodiments of the present disclosure.

In some embodiments, after forming the plurality of contact structures, a conductive layer 1891 can be formed above the alternating conductor/dielectric layer stack 1664 and the insulating structure 1682 and electrically connected with the plurality of staircase contacts 1738 and the BSG contacts 1762, 1764, 1766. The conductive layer 1891 can then be patterned and etched to form a plurality of connecting lines 1899 each connecting with one or more corresponding contact structures respectively. The connecting lines 1899 can be used to electrically connect the plurality of word lines, TSGs, and/or BSGs to periphery circuits. In some embodiments, one or more connecting lines 1899 can also be used to electrically connect the sub-portions of the BSG segments, such as sub-portions of the BSG segments. For example, a conductive line 1899 in the patterned conductive layer 1891 can be used to electrically connect to both the two sub-portions 784L and 784R of BSG segment 784, as shown in FIG. 7. As another example, conductive lines 1899 in the patterned conductive layer 1891 can be used to electrically connect between the two sub-portions 882L and 882R of BSG segment 882, and between the two sub-portions 883L and 883R of BSG segment 883 respectively, as shown in FIG. 8. In some embodiments, any suitable dielectric material 1893 can be used to fill the gaps between conductive lines 1899 in the patterned conductive layer 1891.

In summary, the present disclosure describes various embodiments of a 3D memory device and methods of making the same.

One aspect of the present disclosure provides a three-dimensional (3D) memory device, comprising: an alternating conductor/dielectric layer stack disposed on a substrate; a first staircase structure and a second staircase structure formed in the alternating conductor/dielectric layer stack; a staircase bridge extending in a first direction and electrically connecting the first staircase structure and the second staircase structure; and a first bottom select gate segment covered or partially covered by the staircase bridge, wherein the first bottom select gate segment includes an extended portion extending in a second direction different from the first direction.

In some embodiments, the alternating conductor/dielectric layer stack includes a plurality of conductive layers and dielectric layer arranged alternatively in a vertical direction; the staircase bridge is configured to electrically connect the conductive layers in the first staircase structure with the conductive layers in the second staircase structure, respectively.

In some embodiments, the staircase bridge comprises the plurality of conductive and dielectric layer pairs.

In some embodiments, the 3D memory device further comprises at least one first bottom select gate contact contacting the extended portion of the first bottom select gate segment.

In some embodiments, the 3D memory device further comprises a bottom select gate cut structure separating a bottom conductive layer of the alternating conductor/dielectric layer stack to at least the first bottom select gate segment and a second bottom select gate segment; wherein the bottom select gate cut structure includes one or more non-linear sections.

In some embodiments, the bottom select gate cut structure separates the second bottom select gate segment into two sub-portions of the second bottom select gate segment; and the two sub-portions of the second bottom select gate segment are electrically connected with each other through at least two second bottom select gate contacts and a conductive line in a patterned conductive layer located above the alternating conductor/dielectric layer stack.

In some embodiments, the non-linear sections of the bottom select gate cut structure include a first straight portion extended along the first direction and a second straight portion extended along the second direction.

In some embodiments, the staircase bridge comprises a top longer than a bottom in the durst direction.

In some embodiments, the 3D memory device further comprises a plurality of memory strings vertically penetrating through the alternating conductor/dielectric layer stack, the plurality of memory strings each comprising: a core filling film in a center; a channel layer surrounding the core filling film; and a memory film surrounding the channel layer.

In some embodiments, the plurality of memory strings are distributed on opposite sides of the first staircase structure and the second staircase structure.

In some embodiments, the first staircase structure and the second staircase structure are located in a center of a memory array of the 3D memory device.

Another aspect of the present disclosure provides a method for forming a three-dimensional (3D) memory device, comprising: forming at least one bottom select gate cut structure in at least one bottom dielectric layer pair on a substrate, wherein the at least one bottom select gate cut structure include one or more non-linear sections; forming an alternating dielectric stack on the at least one bottom dielectric layer pair, wherein the alternating dielectric stack comprises a plurality of dielectric layers and sacrificial layers arranged alternatively in a vertical direction; and forming a first dielectric staircase structure, a second dielectric staircase structure and a dielectric bridge in the alternating dielectric stack, wherein the first and second dielectric staircases are connected by the dielectric bridge extended in a first direction.

In some embodiments, the method further comprises: replacing the sacrificial layers in the alternating dielectric stack and the at least one bottom dielectric layer pair with a plurality of conductive layers to form an alternating conductor/dielectric layer stack.

In some embodiments, the method further comprises: forming a plurality of contact structures on the conductive layers of the alternating conductor/dielectric layer stack; wherein a bottom conductive layer of the alternating conductor/dielectric layer stack is divided by the at least one bottom select gate cut structure to a first bottom select gate segment and a second bottom select gate segment.

In some embodiments, forming the plurality of contact structures comprises forming at least one first bottom select gate contact contacting with an extended portion of the first bottom select gate segment that extends along a second direction different from the first direction.

In some embodiments, forming the plurality of contact structures comprises forming at least two second bottom select gate contacts contacting with at least two sub-portions of the second bottom select gate segment.

In some embodiments, the method further comprises forming a patterned conductive layer including at least one connecting line electrically connected the at least two sub-portions of the second bottom select gate segment through the at least two second bottom select gate contacts.

In some embodiments, the method further comprises: forming a plurality of memory strings vertically penetrating through the alternating dielectric stack, wherein the plurality of memory strings each comprises: a core filling film in a center; a channel layer surrounding the core filling film; and a memory film surrounding the channel layer.

In some embodiments, forming the plurality of memory strings comprises forming the plurality of memory strings on opposite sides of the first dielectric staircase structure and the second dielectric staircase structure.

In some embodiments, forming first staircase structure and the second staircase structure comprises forming the first staircase structure and the second staircase structure in a center location of the alternating dielectric stack.

The foregoing description of the specific embodiments will so fully reveal the general nature of the present disclosure that others can; by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately, performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
an alternating conductor/dielectric layer stack disposed on a substrate;
a first staircase structure and a second staircase structure formed in the alternating conductor/dielectric layer stack;
a staircase bridge extending in a first direction and electrically connecting the first staircase structure and the second staircase structure; and
a first bottom select gate segment covered or partially covered by the staircase bridge, wherein the first bottom select gate segment includes:
a first portion extending across the first and second staircase structures and uncovered by the staircase bridge; and
a second portion extending from the first portion in a second direction.

2. The 3D memory device of claim 1, wherein:
the alternating conductor/dielectric layer stack includes a plurality of conductive layers and dielectric layers arranged alternatively in a vertical direction; and
the staircase bridge is configured to electrically connect the conductive layers in the first staircase structure with the conductive layers in the second staircase structure, respectively.

3. The 3D memory device of claim 1, wherein the staircase bridge comprises a plurality of conductive and dielectric layer pairs.

4. The 3D memory device of claim 1, further comprising: at least one first bottom select gate contact contacting the second portion of the first bottom select gate segment.

5. The 3D memory device of claim 1, further comprising:
a bottom select gate cut structure separating a bottom conductive layer of the alternating conductor/dielectric layer stack to at least the first bottom select gate segment and a second bottom select gate segment;
wherein the bottom select gate cut structure includes one or more non-linear sections.

6. The 3D memory device of claim 5, wherein:
the bottom select gate cut structure separates the second bottom select gate segment into two sub-portions of the second bottom select gate segment; and
the two sub-portions of the second bottom select gate segment are electrically connected with each other through at least two second bottom select gate contacts and a conductive line in a patterned conductive layer located above the alternating conductor/dielectric layer stack.

7. The 3D memory device of claim 5, wherein:
the non-linear sections of the bottom select gate cut structure include a first straight portion extended along the first direction and a second straight portion extended along the second direction.

8. The 3D memory device of claim 1, wherein the staircase bridge comprises a top longer than a bottom in the first direction.

9. The 3D memory device of claim 1, further comprising:
a plurality of memory strings vertically penetrating through the alternating conductor/dielectric layer stack, the plurality of memory strings each comprising:
a core filling film in a center;
a channel layer surrounding the core filling film; and
a memory film surrounding the channel layer.

10. The 3D memory device of claim 9, wherein the plurality of memory strings are distributed on opposite sides of the first staircase structure and the second staircase structure.

11. The 3D memory device of claim 1, wherein the first staircase structure and the second staircase structure are located in a center of a memory array of the 3D memory device.

12. A three-dimensional (3D) memory device, comprising:
a bottom conductive layer disposed on a substrate; and
an alternating conductor/dielectric layer stack on the bottom conductive layer and comprising:
a staircase bridge; and
first and second staircase structures connecting to one side of the staircase bridge, wherein a portion of the bottom conductive layer extending across the first and second staircase structures is uncovered by the alternating conductor/dielectric layer stack.

13. The 3D memory device of claim 12, wherein:
the staircase bridge extends in a first direction parallel to the substrate; and
the portion of the bottom conductive layer extends in a second direction parallel to the substrate and different from the first direction.

14. The 3D memory device of claim 12, further comprising a cut structure separating the portion of the bottom conductive layer into first and second sections, wherein the first section is disposed adjacent to the staircase bridge and partially enclosed by the second section.

15. The 3D memory device of claim 12, further comprising:
a conductive layer on the alternating conductor/dielectric layer stack; and
a vertical contact electrically connecting the conductive layer and the portion of the bottom conductive layer, wherein the vertical contact is between the first and second staircase structures.

16. A three-dimensional (3D) memory device, comprising:
first and second bottom conductive layers on a substrate and separated by a cut structure, wherein a portion of the second bottom conductive layer is partially enclosed by the cut structure;
first and second staircase structures on the first bottom conductive layer, wherein the portion of the second bottom conductor layer is between the first and second staircase structures; and
a staircase bridge on the second bottom conductive layer and adjacent to one side of the first and second staircase structures.

17. The 3D memory device of claim 16, wherein each of the first and second staircase structures comprises a plurality of staircases, and wherein each of the plurality of staircases comprises a dielectric layer and a conductive layer on the dielectric layer.

18. The 3D memory device of claim 16, further comprising a plurality of memory strings disposed on opposite sides of the first and second staircase structures.

19. The 3D memory device of claim 16, wherein the cut structure comprises first and second sections adjacent to the portion of the second bottom conductive layer, wherein the first and the second sections extend along first and second horizontal directions, respectively.

20. The 3D memory device of claim 16, wherein:
the portion of the second bottom conductive layer is uncovered by the staircase bridge; and
the portion of the second bottom conductive layer extends across the first and second staircase structures.

21. The 3D memory device of claim 16, further comprising a bottom select gate contact between the first and second staircase structures and contacting the portion of the second bottom conductor layer.

* * * * *